(12) United States Patent
Pala et al.

(10) Patent No.: US 11,211,484 B2
(45) Date of Patent: Dec. 28, 2021

(54) VERTICAL TRANSISTOR STRUCTURE WITH BURIED CHANNEL AND RESURF REGIONS AND METHOD OF MANUFACTURING THE SAME

(71) Applicant: MONOLITHIC POWER SYSTEMS, INC., San Jose, CA (US)

(72) Inventors: Vipindas Pala, San Jose, CA (US); Sundarsan Uppili, Portland, OR (US)

(73) Assignee: Monolithic Power Systems, Inc., San Jose, CA (US)

( * ) Notice: Subject to any disclaimer, the term of this patent is extended or adjusted under 35 U.S.C. 154(b) by 175 days.

(21) Appl. No.: 16/786,972

(22) Filed: Feb. 10, 2020

(65) Prior Publication Data
US 2020/0259012 A1    Aug. 13, 2020

Related U.S. Application Data

(60) Provisional application No. 62/805,089, filed on Feb. 13, 2019.

(51) Int. Cl.
*H01L 29/78* (2006.01)
*H01L 29/66* (2006.01)
(Continued)

(52) U.S. Cl.
CPC ........ *H01L 29/7803* (2013.01); *H01L 29/063* (2013.01); *H01L 29/1045* (2013.01);
(Continued)

(58) Field of Classification Search
CPC ... H01L 29/06; H01L 29/063; H01L 29/0847; H01L 29/16; H01L 29/1095;
(Continued)

(56) References Cited

U.S. PATENT DOCUMENTS 4,518,926 A    5/1985 Swanson
5,610,424 A    3/1997 Park
(Continued)

OTHER PUBLICATIONS

Extended European Search Report dated Sep. 18, 2020 from European Patent Application No. 20156773.2, 13 pages.
(Continued)

*Primary Examiner* — Fazli Erdem
(74) *Attorney, Agent, or Firm* — Patrick D. Benedicto

(57) ABSTRACT

The present disclosure describes vertical transistor device and methods of making the same. The vertical transistor device includes substrate layer of first conductivity type, drift layer of first conductivity type formed over substrate layer, body region of second conductivity type extending vertically into drift layer from top surface of drift layer, source region of first conductivity type extending vertically from top surface of drift layer into body region, dielectric region including first and second sections formed over top surface, buried channel region of first conductivity type at least partially sandwiched between body region on first side and first and second sections of dielectric region on second side opposite to first side, gate electrode formed over dielectric region, and drain electrode formed below substrate layer. Dielectric region laterally overlaps with portion of body region. Thickness of first section is uniform and thickness of second section is greater than first section.

20 Claims, 15 Drawing Sheets

(51) Int. Cl.
    *H01L 29/16* (2006.01)
    *H01L 29/423* (2006.01)
    *H01L 29/10* (2006.01)
    *H01L 29/808* (2006.01)
    *H01L 29/06* (2006.01)

(52) U.S. Cl.
    CPC ...... *H01L 29/1095* (2013.01); *H01L 29/1608* (2013.01); *H01L 29/42368* (2013.01); *H01L 29/42376* (2013.01); *H01L 29/8083* (2013.01)

(58) Field of Classification Search
    CPC .............. H01L 29/1608; H01L 29/42; H01L 29/42368; H01L 29/66; H01L 29/66068; H01L 29/78; H01L 29/7803
    USPC .......................................................... 257/77
    See application file for complete search history.

(56) References Cited

U.S. PATENT DOCUMENTS

| | | | |
|---|---|---|---|
| 7,018,876 B2 | 3/2006 | Mathew et al. | |
| 7,342,453 B2 | 3/2008 | Amasuga et al. | |
| 7,501,670 B2 | 3/2009 | Murphy | |
| 7,847,638 B2 | 12/2010 | Ishizuka | |
| 8,097,905 B2 | 1/2012 | Tsuchiko | |
| 8,183,629 B2 | 5/2012 | Pattanayak et al. | |
| 8,207,523 B2 | 6/2012 | Tsai et al. | |
| 8,847,235 B2 | 9/2014 | Rose | |
| 9,276,569 B2 | 3/2016 | Ikeda | |
| 9,281,305 B1 | 3/2016 | Yang et al. | |
| 9,397,089 B2 | 7/2016 | Pan et al. | |
| 9,472,549 B2 | 10/2016 | Rose et al. | |
| 2007/0046379 A1 | 3/2007 | Tanahashi et al. | |
| 2007/0278568 A1* | 12/2007 | Williams | H01L 29/66106 257/335 |
| 2011/0241083 A1* | 10/2011 | Khemka | H01L 29/1083 257/262 |
| 2012/0199849 A1 | 8/2012 | Tsai et al. | |
| 2012/0241756 A1 | 9/2012 | Zhang et al. | |
| 2012/0262220 A1 | 10/2012 | Springett | |
| 2012/0292635 A1 | 11/2012 | Iketani et al. | |
| 2013/0020614 A1 | 1/2013 | Lu et al. | |
| 2014/0091852 A1 | 4/2014 | Norling et al. | |
| 2014/0097701 A1 | 4/2014 | Bailey et al. | |
| 2014/0167100 A1 | 6/2014 | Ichikawa | |
| 2014/0292287 A1 | 10/2014 | Rutter et al. | |
| 2016/0133627 A1 | 5/2016 | Hirler | |
| 2017/0025407 A1 | 1/2017 | Liu et al. | |
| 2018/0166557 A1 | 6/2018 | Padmanabhan et al. | |
| 2019/0058039 A1* | 2/2019 | Cai | H01L 29/1095 |
| 2019/0237576 A1* | 8/2019 | Qiao | H01L 29/7825 |

OTHER PUBLICATIONS

Renato Campana V. et al., "0.5 V Supply Resistorless Voltage Reference for Low Voltage Applications", SBCCI Aug. 31-Sep. 4, 2015, Salvador, Brazil, 2015 ACM, 978-1-4503-3763-2/15/08.

Final Office Action dated Oct. 15, 2020 from U.S. Appl. No. 16/693,226, 14 pages.

Nonfinal Office Action dated Apr. 6, 2020 from U.S. Appl. No. 16/693,226, 15 pages.

Notice of Allowance dated Jun. 11, 2021 from U.S. Appl. No. 16/693,226, 27 pages.

* cited by examiner

VERTICAL TRANSISTOR STRUCTURE WITH BURIED CHANNEL AND RESURF REGIONS AND METHOD OF MANUFACTURING THE SAME

FIELD OF THE INVENTION

The present disclosure relates to power transistor structures, and more particularly, transistor structures of metal-oxide-semiconductor field-effect transistors (MOSFETs), and methods for making such transistor structures.

BACKGROUND OF THE INVENTION

A power metal-oxide-semiconductor field-effect transistor (MOSFET) is a type of MOSFET that is adapted for use as a switching device in electrical circuits, such as, for example, inverters, battery chargers for a mobile phone, and power supplies for servers and industrial equipment, motor drivers for fans, pumps, elevators, industrial machines etc. Generally, the power MOSFET has a vertical structure, where source and gate electrodes are located on a top surface of the body of the power MOSFET, and a drain electrode is located on a bottom surface of the body of the MOSFET. The power MOSFET can be fabricated using a wide band-gap semiconductor such as Silicon Carbide (SiC) to provide the lowest ON resistance in a drift region, while being able to support the highest possible blocking voltage.

A conventional vertical MOSFET generally includes a substrate and a drift layer formed over the substrate. One or more body regions extend into the drift layer from the top surface of the drift layer. A junction gate field effect transistor (JFET) region is provided between the body regions. Each one of the body regions is formed by an ion implantation process and includes at least a source region. Each source region is formed in a shallow portion beneath a top surface of the drift layer. A gate oxide region is formed along the top surface of the drift layer and extends laterally between each source region. A gate electrode is formed over the gate oxide. Source electrodes are formed over source regions, and a drain electrode is formed on a bottom surface of the substrate.

In general, conventional MOSFETs suffer from reduced channel mobility compared to that of the bulk region. In case of power MOSFETs formed of Silicon Carbide, the reduced channel mobility occurs due to a coulomb scattering phenomenon, which is caused by trapped charges at an interface between the body region and the gate oxide region of the MOSFET. The trapped charges at the interface impede flow of electrons across the channel region thereby resulting an increase of electrical resistance of the channel region in the MOSFET. The increase of electrical resistance of the channel region causes degrading of the performance of the MOSFET.

In later stages, to overcome the above problem in the conventional MOSFETs, a transition region (e.g., buried channel region) of appropriate doping concentration is introduced between the body region and the interface. The function of the buried channel region is to create a path for current flow in the channel region that is separated by a distance from the interface. Due to this separation, the trapped charges at the interface are not able to impede the flow of electrons significantly, thereby reducing the resistance in the channel region. Thus, due to inclusion of the buried channel region, the electrical resistance of the MOSFET is reduced. However, for a MOSFET incorporating a buried channel region, a gate threshold voltage required for switching the MOSFET from a non-conducting state to a conducting state also reduces compared to the conventional MOSFET device. If the threshold voltage is reduced to below zero volts, for an N-channel MOSFET, the MOSFET is normally-ON.

In addition, when the MOSFET is turned OFF (OFF-state) and a high voltage is applied at the drain electrode, the introduction of the buried channel region causes an increase in the electric field across the oxide region. This increase in the electric field can cause the oxide region to rupture prematurely, thereby reducing the reliability of the device.

Thus, there is a need for techniques which can overcome one or more limitations stated above in addition to providing other technical advantages.

SUMMARY OF THE INVENTION

This summary is provided only for the purposes of introducing the concepts presented in a simplified form. This is not intended to identify essential features of the claimed invention or limit the scope of the invention in any manner.

In one embodiment, a vertical transistor device is described. The vertical transistor device includes a substrate layer of a first conductivity type and a drift layer of the first conductivity type formed over the substrate layer. The vertical transistor device includes a body region of a second conductivity type extending vertically from a top surface of the drift layer into the drift layer, and a junction field effect transistor (JFET) region of the first conductivity type extending vertically from the top surface into the drift layer and positioning adjacent to an inner edge of the body region. The second conductivity type is opposite to the first conductivity type. The doping concentration of the JFET region is same or higher than the drift layer. The vertical transistor device includes a source region of the first conductivity type extending vertically from the top surface of the drift layer into the body region, and a buried channel region of the first conductivity type at least partially sandwiched between the body region on a first side and a dielectric region on a second side opposite to the first side. A portion of the buried channel region makes an electrical connection with the source region and a portion of the buried channel region also extends beyond a lateral extent of the body region to make an electrical connection with the JFET region. The vertical transistor device further includes a dielectric region formed over the top surface of the drift layer and laterally overlapping with at least a portion of the body region. The dielectric region includes at least a first section and a second section being adjacent to the first section and the thickness of the first section is uniform and thickness of the second section is greater than the first section. A portion of the second section of the dielectric region overlaps at least the body region and the buried channel region. The vertical transistor device includes a gate electrode formed over the dielectric region and a drain electrode formed below the substrate layer.

In another embodiment, a Silicon Carbide (SiC) vertical transistor device is described. The vertical transistor device includes a substrate layer of a first conductivity type and a drift layer of the first conductivity type formed over the substrate layer. The vertical transistor device includes a body region of a second conductivity type extending vertically from a top surface of the drift layer into the drift layer, and a junction field effect transistor (JFET) region of the first conductivity type extending vertically from the top surface into the drift layer and positioning adjacent to an inner edge of the body region. The second conductivity type is opposite to the first conductivity type. The doping concentration of the JFET region is same or higher than the drift layer. The vertical transistor device includes a source region of the first conductivity type extending vertically from the top surface of the drift layer into the body region, and a buried channel region of the first conductivity type formed below the top surface and extended laterally across a portion of the body region and being at least partially overlapped with a dielectric region. A portion of the buried channel region makes an electrical connection with the source region and a portion of the buried channel region also extends beyond a lateral extent of the body region to make an electrical connection with the JFET region. The vertical transistor device includes a dielectric region formed over the top surface of the drift layer and laterally overlapping with at least a portion of the body region. The dielectric region includes at least a first section and a second section being adjacent to the first section and the thickness of the first section is uniform and thickness of the second section is greater than the first section. A portion of the second section of the dielectric region overlaps at least the body region and the buried channel region. The vertical transistor device also includes a base region of the second conductivity type extending vertically into the drift layer from the top surface and positioning adjacent to an outer edge of the body region opposite the JFET region. The vertical transistor device further includes a gate electrode formed over the dielectric region, a source electrode formed over the source region and at least partially overlapping the base region, and a drain electrode formed below the substrate layer. The gate electrode has a discontinuous structure and does not overlap a central portion of the JFET region.

In yet another embodiment, a vertical Silicon Carbide (SiC) metal-oxide-semiconductor field-effect transistor (MOSFET) is described. The vertical SiC MOSFET includes a substrate layer of a first conductivity type and a drift layer of the first conductivity type formed over the substrate layer. The vertical SiC MOSFET includes a body region of a second conductivity type extending vertically from a top surface of the drift layer into the drift layer, and a junction field effect transistor (JFET) region of the first conductivity type extending vertically from the top surface into the drift layer and positioning adjacent to an inner edge of the body region. The second conductivity type is opposite to the first conductivity type. The doping concentration of the JFET region is same or higher than the drift layer. The vertical SiC MOSFET includes a source region of the first conductivity type extending vertically from the top surface of the drift layer into the body region, and a buried channel region of the first conductivity type formed below the top surface and extended laterally across a portion of the body region and being at least partially overlapped with a dielectric region. The buried channel region makes an electrical connection with the source region and also extends beyond a lateral extent of the body region to make an electrical connection with the JFET region. The vertical SiC MOSFET includes a dielectric region formed over the top surface of the drift layer and laterally overlapping with at least a portion of the body region. The dielectric region includes at least a first section and a second section being adjacent to the first section and the thickness of the first section is uniform and thickness of the second section is greater than the first section. A portion of the second section of the dielectric region overlaps at least the body region and the buried channel region. The vertical SiC MOSFET also includes a base region of the second conductivity type extending vertically into the drift layer from the top surface and positioning adjacent to an outer edge of the body region opposite the JFET region. The vertical SiC MOSFET further includes a gate electrode formed over the dielectric region, and a drain electrode formed below the substrate layer. The gate electrode has a discontinuous structure and does not overlap a central portion of the JFET region.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION OF THE INVENTION

Figure 1:
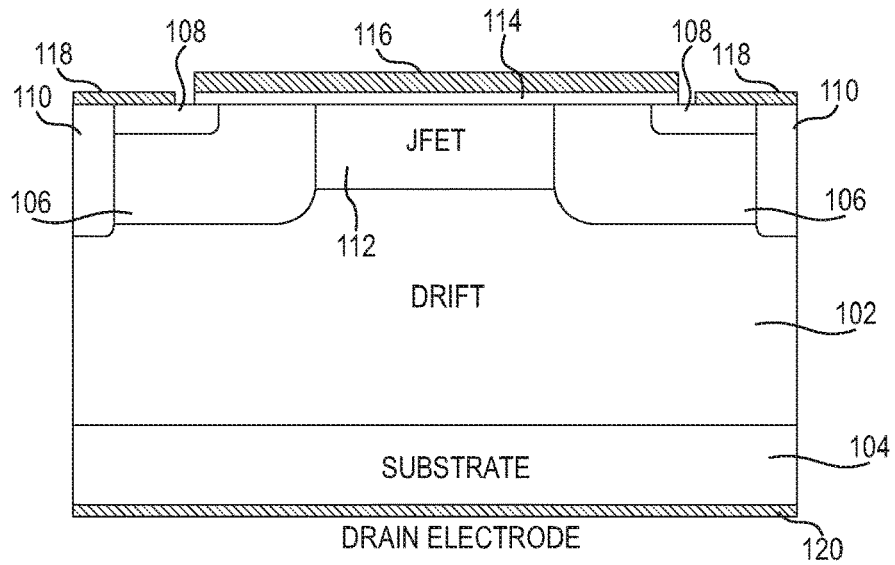
FIG. 1 illustrates a cross-sectional view of a conventional metal oxide semiconductor field effect transistor (MOSFET) device.

In the following detailed description, numerous specific details are set forth in order to provide a thorough understanding of the present technology. However, the present technology may be practiced without these specific details. In other instances, well-known methods, procedures, components, and circuits have not been described in detail so as to not unnecessarily obscure aspects of the exemplary embodiments presented herein. Moreover, it is noted that structures and devices are shown in block diagram form in order to avoid obscuring the disclosure.

Reference in this specification to "one embodiment" or "an embodiment" means that a particular feature, structure, or characteristic described in connection with the embodiment is included in at least one embodiment of the disclosure. The appearance of the phrase "in one embodiment" in various places in the specification is not necessarily all referring to the same embodiment, nor are separate or alternative embodiments mutually exclusive of other embodiments. Moreover, various features are described which may be exhibited by some embodiments and not by others. Similarly, various parameters are described that may be parameters for some embodiments but not for other embodiments.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Relative terms such as "below" or "above" or "upper" or "lower" or "horizontal" or "lateral" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Embodiments of the present disclosure are described herein with reference to cross-section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the precise shape of a region of a device and are not intended to limit the scope of the present disclosure.

One commonly used conventional power MOSFET device is a MOSFET device 100, as illustrated in FIG. 1 (prior art). The MOSFET device 100 may be a vertical Silicon carbide (SiC) MOSFET device. In general, the vertical Silicon carbide MOSFET device 100 may be referred to as vertical doubly implanted MOSFET device. The MOSFET device 100 may be formed by a plurality of unit-cells and some structural elements. For ease of illustration, a single unit cell of the MOSFET device 100 is described. Also for ease of illustration, an N-channel MOSFET is described, but it should be noted that such teachings of the present disclosure can also be applied to a P-channel MOSFET.

The MOSFET device 100 includes a substrate 104, an N-type drift layer 102 formed over the substrate 104, one or more P-type body regions 106 implanted into a surface of the N-type drift layer 102 opposite the substrate 104, and a junction gate field effect transistor (JFET) region 112 from the surface between each one of the P-type body regions 106. For example, the N-type drift layer 102 and the substrate 104 may be fabricated by using semiconductor materials such as Silicon carbide, Silicon, Gallium Nitride, or any other materials as per feasibility and requirements. The P-type body regions 106 are implanted into the N-type drift layer 102 and extended from the N-type drift layer 102 opposite the substrate 104 downwards towards the substrate 104 and inwards towards the center of the N-type drift layer 102. In an example, the P-type body region 106 may be formed by implantation of acceptor ions such as Aluminum, Boron or any other element as per design feasibility and requirement.

An N+ type source region 108 is disposed within the P-type body region 106. The N+ type source region 108 may be fabricated by implantation of donor ions such as Nitrogen or Phosphorus or any other materials as per design feasibility and requirement. Further, the MOSFET device 100 includes a P type base region 110 formed vertically from the top surface of the N-type drift layer 102 opposite the substrate 104 down towards the substrate 104 along a portion of an outer edge of each one of the P-type body regions 106. For example, the P-type base region 110 may be fabricated by implantation of acceptor ions, such as Boron, Aluminum or any other materials as per design feasibility and requirement. In an example, the P-type base region 110 may be fabricated by particularly using implanted Aluminum due to lower diffusivity of the Aluminum in the vertical Silicon carbide MOSFET device 100.

The JFET region 112 generally is an active portion of the N-type drift layer 102 which may include an N-type (i.e., a donor type) dopant and is located between two P-type body regions, such as P-type body region 106. The JFET region 112 makes up a conduction path for electrons with the N+ type source region 108, a channel region, the N-type drift layer 102, the substrate 104, and a drain electrode 120. The JFET region 112 may be provided by epitaxial growth or by ion implantation. The doping concentration of the JFET region 112 may be same as drift region, or additional dopants may be introduced in the JFET region 112 to reduce the resistance of the MOSFET by implantation of donor ions such as Nitrogen or Phosphorus or any other materials as per design feasibility or requirement. The additional doping can also be introduced in the JFET region 112 during epitaxial growth of the drift region.

A dielectric region 114 of uniform thickness is positioned on the surface of the N-type drift layer 102 opposite the substrate 104, and overlaps with a portion of the surface of each N+ type source region 108 and P-type body region 106, such that the dielectric region 114 partially overlaps and runs between the surface of each N+ type source region 108 in the P-type body regions 106. In other words, the dielectric region 114 extends laterally over a portion of the P-type body region 106, the N+ type source region 108, and the JFET region 112. The dielectric region 114 may be fabricated by using a dielectric material such as Silicon dioxide (SiO$_2$), silicon nitride (SiN) or any other materials as per feasibility and requirement.

A gate electrode 116 is positioned on top of the dielectric region 114 such that the gate electrode 116 partially overlaps the N+ type source region 108. Two source electrodes 118 are each positioned on the surface of the N-type drift layer 102 opposite the substrate 104 such that each one of the source electrodes 118 partially overlaps both the N+ type source region 108 and a portion of the P-type base region 110 and does not contact the dielectric region 114 or the gate electrode 116.

The drain electrode 120 is electrically connected to the substrate 104. In other words, the drain electrode 120 is located on the surface of the substrate 104 opposite to the N-type drift layer 102. For example, the drain electrode 120 and the source electrode 118 may be fabricated using materials such as Nickel (Ni) or any other materials as per design feasibility and requirement.

In operational state, when a biasing voltage is not applied to the gate electrode 116 and the drain electrode 120 is positively biased, a P-N junction formed between each P-type body region 106 and the N-type drift layer 102 is reverse biased, thereby placing the MOSFET device 100 in an OFF state. In the OFF state of the MOSFET device 100, a voltage between the source electrode 118 and the drain electrode 120 is supported by the N-type drift layer 102. Due to the vertical structure of the conventional power MOSFET device 100, large voltages may be placed between the source electrode 118 and the drain electrode 120.

In a typical Silicon Carbide MOSFET, electron mobility of the channel region is lower than the electron mobility in the bulk region in the drift layer 102. The limited electron mobility in the channel region may occur due to a coulomb scattering phenomenon, which is caused by trapped charges at a dielectric-semiconductor interface between the body region 106 and the dielectric region 114 of the MOSFET device 100. The trapped charges at the interface impedes flow of electrons across the channel region thereby resulting an increase of electrical resistance of the MOSFET device 100. For example, the configuration of the Silicon Carbide MOSFET similar to MOSFET device 100 exhibits the electron mobility of 30 cm$^2$/V/s which is approximately ⅒ lower the traditional Silicon MOSFET. In addition, the traditional MOSFET device 100 shown in FIG. 1 may have a high electrical field at the interface between the JFET region 112 and the dielectric region 114 of the MOSFET device 100 when the MOSFET device 100 is in the OFF state and a high voltage is applied at the drain electrode 120. The high electrical field combined with any imperfections in the interface and the dielectric region 114 could result in the dielectric region 114 to rupture prematurely under an operation, in which the drain electrode 120 is placed under a high positive bias.

Figure 2:
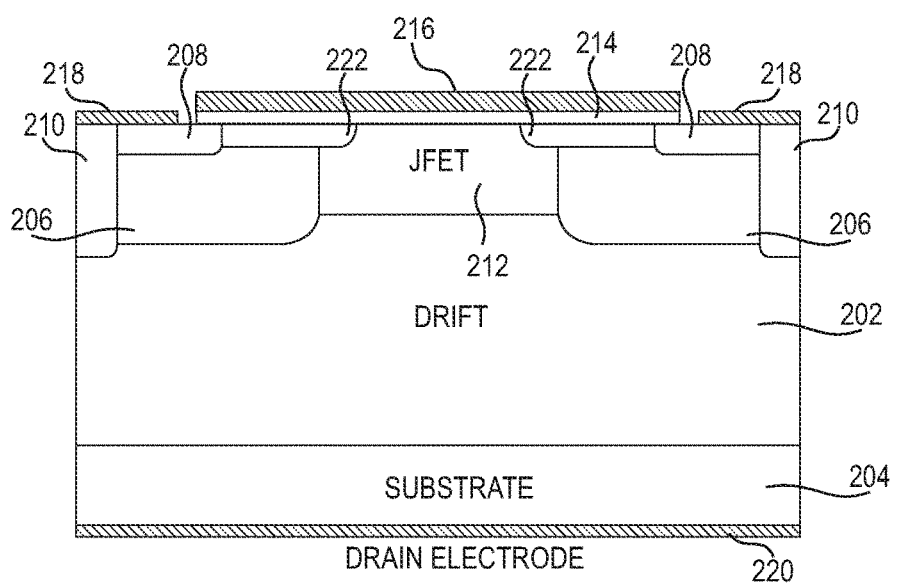
FIG. 2 illustrates a cross-sectional view of another conventional MOSFET device with a buried channel region.

FIG. 2 illustrates a cross-sectional view of another conventional MOSFET device 200 with a buried channel region (prior art). The structure of the MOSFET device 200 is similar to the structure of the MOSFET device 100, except that an N-type buried channel region 222 is introduced in each of the body region 206. The N-type buried channel region 222 is electrically coupled to an N+ type source region 208 within the body region 206 and extends laterally across a portion of the body region 206 to a JFET region 212. The N-type buried channel region 222 overlaps a dielectric region 214 with uniform thickness. Other structural components (such as, for example, a N-type drift layer 202, a substrate 204, a P-type base region 210, a gate electrode 216, a source electrode 218, a drain electrode 220 etc.) remain same as mentioned for describing the MOSFET device 100 of FIG. 1. Therefore, for the sake of brevity, other structural components are not described herein in detail.

It is noted that the N-type buried channel region 222 provides a conductive path at a dielectric-semiconductor interface and reduces the effect of coulomb scattering. However, inclusion of the N-type buried channel region 222 in the MOSFET device 200 results an increase of the magnitude of electric field across the dielectric region 214 when a high voltage is applied at the drain electrode 220 in the OFF state of the MOSFET device 200.

Various embodiments of the present disclosure provide a vertical transistor device of a wide band-gap semiconductor material with a structure such that electric field at a dielectric-semiconductor interface does not increase high enough for rupturing a dielectric region in the OFF state and further, the electric field in the dielectric region is also reduced drastically compared to conventional devices. The vertical transistor device includes a substrate layer, a drift layer, a body region, a source region, a base region, a JFET region, and a buried channel region inside the body region.

Unlike conventional devices, the vertical transistor device includes the dielectric region with a gradual step thickness profile, which has a gradual step from a thin dielectric region to a thicker dielectric region. During ON state, a channel region is formed in the buried channel region where a gate electrode overlaps the buried channel region and the body region and the thin dielectric region. The gate threshold voltage is dependent on the thickness of the thin dielectric region and charge in the buried channel region and the body region vertically under the gate electrode in the channel region. Moreover, the vertical transistor device has a reduced surface field (RESURF) region where the gate electrode overlaps the buried channel region and the thicker dielectric region. Due to the RESURF region, the electric field is reduced in the dielectric region during the OFF state, when a high drain voltage is applied, thereby providing better performance and increasing reliability of the vertical transistor device. Further, as the RESURF region is formed in the buried channel region, the RESURF region also acts as a conductive channel during the ON state.

Figure 3A:
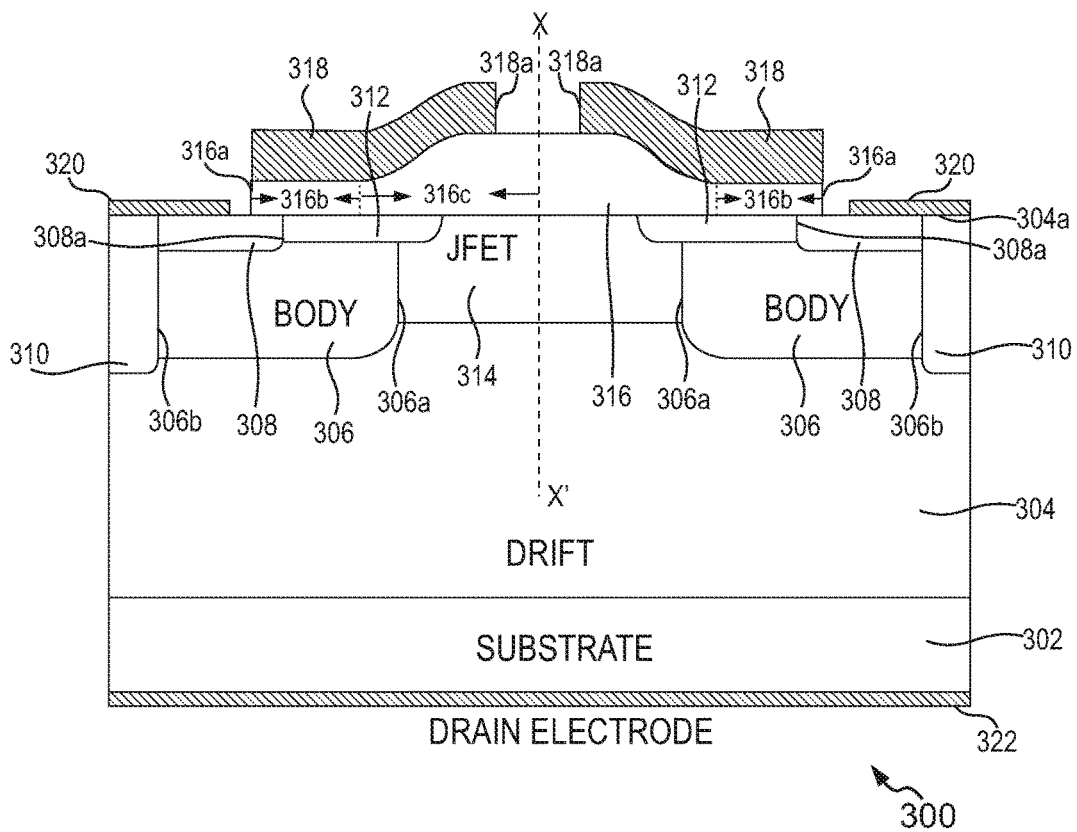
FIG. 3A is a cross sectional illustration of a unit cell structure of a vertical transistor device, in accordance with an exemplary embodiment of the present disclosure.

FIG. 3A is a cross sectional illustration of a unit cell structure of a vertical transistor device 300, in accordance with an exemplary embodiment of the present disclosure. In one embodiment, the vertical transistor device 300 may be formed by a plurality of unit-cells and some structural elements. For ease of illustration, a single unit cell of the vertical transistor device 300 will be described. The single unit cell of the vertical transistor device 300 has a lateral extent in an order of few microns. In one embodiment, the vertical transistor device 300 is made of a wide-bandgap semiconductor material. In one embodiment, the vertical transistor device 300 is a Metal-Oxide Semiconductor Field-Effect Transistor (MOSFET) device and even more preferably a Silicon Carbide (SiC) MOSFET device. For ease of understanding, the term "vertical transistor device 300" is hereinafter interchangeably referred to as "MOSFET 300" throughout the description. In an embodiment, the vertical transistor device 300 may more generally be any type of device having a transistor (e.g., a power MOSFET; a double implanted field effect transistor (DIMOSFET); an insulated gate bipolar transistor (IGBT); and the like). The following description is written with an understanding that the description (with regards to the MOSFET 300) pertains to a doubly implanted configuration of the MOSFET 300 where one or more regions (e.g., base region, body region etc.) are implanted symmetrically with reference to a central axis X-X'. Further, the MOSFET 300 described herein is an N-channel MOSFET is for example purposes only, and similar concepts mentioned throughout the description can also be applied to a P-channel MOSFET.

In one embodiment, the MOSFET 300 may be a widebandgap vertical MOSFET incorporating a semiconducting material with a bandgap energy exceeding 1.5 electron Volts. The semiconducting material may be selected to be a Silicon Carbide (SiC), Gallium Nitride (GaN), Aluminum Gallium Nitride (AlGaN), Aluminum Nitride (AlN), Gallium Oxide, Diamond or any other material as per design requirement. In one embodiment, the MOSFET 300 may be an enhancement mode Silicon carbide (SiC) MOSFET. In another embodiment, the MOSFET 300 may be a depletion mode SiC MOSFET.

As shown in the FIG. 3A, the MOSFET 300 includes at least a substrate layer 302, a drift layer 304, a body region 306, a source region 308, a buried channel region 312, a junction field effect transistor (JFET) region 314, a base region 310, and a dielectric region 316.

The substrate layer 302 is doped with a first conductivity type (e.g., N-type SiC). In one embodiment, the substrate layer 302 is composed of heavily doped SiC polytypes, such as, for example 3H-SiC, 4H-SiC, and 6H-SiC. In one embodiment, the substrate layer 302 may be doped with the first conductivity type (e.g., N-type SiC or N-type GaN) dopants at a doping concentration of about greater than $5 \times 10^{17}$ cm$^{-3}$ with a thickness of about 30 to 400 μm.

The drift layer 304 is formed on the substrate layer 302. The drift layer 304 is epitaxially grown on the substrate layer 302. The drift layer 304 is doped with an appropriate doping level of the first conductivity type (e.g., N-type SiC or N-type GaN) dopants. In one embodiment, the drift layer 304 may be doped with N-type dopants at a doping concentration of about $1.5 \times 10^{15}$ cm$^{-3}$ to about $3 \times 10^{16}$ cm$^{-3}$ with a thickness of about 4 to 30 μm.

The body region 306 of a second conductivity type extends from a top surface 304a of the drift layer 304 into the drift layer 304. Due to doubly implanted configuration of the MOSFET 300, the body region 306 is implanted symmetrically to the central axis X-X' in the drift layer 304, such that the one or more body regions 306 extends from the top surface 304a into the drift layer 304. In one example, the second conductivity type is opposite to the first conductivity type. In one embodiment, the body region 306 may be doped with the second conductivity type (e.g., P-type SiC or P-type GaN) at a heavy doping concentration of about $1 \times 10^{16}$ cm$^{-3}$ to about $1 \times 10^{19}$ cm$^{-3}$ to a depth of about 0.5 to 3 μm.

The source region 308 of the first conductivity type (e.g., N-type SiC or N-type GaN) is implanted within each body region 306. In one embodiment, the source region 308 may be doped with the first conductivity type (e.g., N-type SiC or N-type GaN) at a heavy doping concentration of about $1 \times 10^{18}$ cm$^{-3}$ to about $1 \times 10^{21}$ cm$^{-3}$ to a depth of about 0.1 to 0.5 μm.

The base region 310 of the second conductivity type is implanted from the top surface 304a into the drift layer 304. The base region 310 extends vertically downwards from the top surface 304a of the drift layer 304 such that the base region 310 is in contact or conductively coupled with at least an outer edge (see, 306b) of the body region 306. Further, the base region 310 and source region 308 are electrically connected to a source electrode 320 through an ohmic contact. In one example embodiment, the base region 310 may be fabricated by implantation of acceptor ions, such as Boron, Aluminum or any other materials as per design feasibility and requirement. In another embodiment, the base region 310 may be fabricated by particularly using implanted Aluminum due to lower diffusivity of the Aluminum in the MOSFET 300. Further, the base region 310 may be relatively highly doped so as to reduce and/or prevent turning on a parasitic n-p-n transistor formed by the source region 308, the body region 306 and the drift layer 304.

The buried channel region 312 of the first conductivity type is implanted from the top surface 304a of the drift layer 304 into each body region 306 using ion-implantation techniques. The buried channel region 312 is sandwiched laterally across a portion of the body region 306 and in contact with an edge (see, 308a) of the source region 308. The buried channel region 312 also extends laterally beyond the body region 306 into the JFET region 314. Thus, the buried channel region 312 is electrically connected to the JFET region 314 of the MOSFET 300. In one embodiment, the extension of the buried channel region 312 beyond the body region 306 into the JFET region 314 may have a lateral distance of about 50 nm to 500 nm.

The buried channel region 312 may be fabricated with an appropriate doping concentration and thickness so that a conductive channel region is formed to link the source region 308, the buried channel region 312 and the JFET region 314. In one embodiment, the buried channel region 312 may have a doping concentration greater than about $10^{16}$ cm$^{-3}$ and may extend a depth of about 0.03 μm to 0.3 μm into the drift layer 304. In one embodiment, the buried channel region 312 may be fabricated by using a tilted implantation technique which is explained further with reference to FIG. 7C.

In one embodiment, the vertical transistor device 300 is a normally-on transistor device because of the buried channel region 312.

The JFET region 314 of the first conductivity type is implanted from the top surface 304a of the drift layer 304 and positioned adjacent to an inner edge 306a of the body region 306 within the drift layer 304. The JFET region 314 is an active portion of the drift layer 304 which may include N-type (i.e., donor type) dopants and is located between two body regions, such as the body region 306. The JFET region 314 may be incorporated in the MOSFET 300 by using either ion implantation technique, epitaxial growth or diffusion technique. In certain embodiments, the JFET region 314 may have a thickness ranging from about 0.5 μm to about 3 μm and may have a doping concentration greater than about $10^{16}$ cm$^{-3}$. The JFET region 314 may have a width from about 0.3 μm to about 2 μm. In one embodiment, the doping concentration of the JFET region 314 may be same as the drift layer 304, or additional dopants may be introduced in the JFET region 314 to reduce the resistance of the MOSFET 300 by implantation of donor ions such as Nitrogen or Phosphorus or any other materials as per design feasibility or requirement. In one embodiment, the additional doping can also be introduced in the JFET region 314 during epitaxial growth of the drift layer 304. The JFET region 314 provides a conductive path to flow of electrons between the source region 308, the buried channel region 312, the drift layer 304, and the substrate layer 302.

The dielectric region 316 is disposed over the top surface 304a (i.e., dielectric-semiconductor interface) of the drift layer 304 such that the dielectric region 316 is symmetric to the central axis X-X' of the MOSFET 300. The dielectric region 316 extends laterally over the top surface 304a (i.e., dielectric-semiconductor interface) of the drift layer 304 for overlapping at least some portions of each body region 306 and the JFET region 314. The dielectric region 316 has a gradual step thickness profile, where the thickness of the dielectric region 316 increases in proportion to a distance of a point from the body region 306 to the JFET region 314. In one embodiment, the dielectric region 316 has an abrupt thickness profile.

In one embodiment, the dielectric region 316 may employ a graded thickness profile throughout all or a portion thereof. The thickness profile of the dielectric region 316 generally increases in a stepwise or continuous fashion from a point on the top surface of the body region 306 to a point on the top surface of the JFET region 314. For example, the dielectric region 316 has an increasing slope from a thin dielectric region (see, "316b") to a thicker dielectric region (i.e., "a maximum thickness value of the dielectric region"). The thin dielectric region (see, "316b") is placed in a manner so that it partially overlaps the source region 308 and the buried channel region 312. The thicker dielectric region is overlapped horizontally with a central portion of the JFET region 314. In one example, the thin dielectric region may have a thickness ranging between 250 Angstroms to 1000 Angstroms and the thicker dielectric region may have a thickness ranging between 1000 Angstroms to 20000 Angstroms.

In one embodiment, the dielectric region 316 includes a first section 316b and a second section 316c. The first section 316b represents the thin dielectric region positioned near a sidewall 316a of the dielectric region 316. The thickness of the first section 316b is uniform. The first section 316b corresponds to a region laterally extending from a side wall 316a of the dielectric region 316 and at least overlapping the source region 308 and the buried channel region 312. The sidewall 316a of the dielectric region 316 may partially reside within the source region 308. In another embodiment, the sidewall 316a may be spaced apart from the source region 308.

The second section 316c is positioned adjacent to the first section 316b and partially overlapping the buried channel region 312 and the body region 306. The thickness of the second section 316c gradually increases from a thickness value corresponding to the first section (i.e., "thin dielectric region") to the thicker dielectric region (i.e., "a maximum thickness value of the dielectric region").

Similarly, the sidewall 316a of the dielectric region 316 residing over the source region 308 towards right of the central axis X-X' is provided with an isotropic etch. It is understood that the same method and techniques are applicable for the sidewall 316a residing towards right of the central axis X-X' without departing from the scope of the present disclosure. Thus, it is evident that the structure and configuration of the dielectric region 316 are symmetric to the central axis X-X' of the MOSFET 300.

In conclusion, the first section 316b and the second section 316c constitute the gradual step thickness profile configuration of the dielectric region 316. In addition, such structure of the dielectric region 316 in the MOSFET 300 is configured to reduce magnitude of electric field in the MOSFET 300 which will be explained in further sections of the description in detail.

Further, the MOSFET 300 includes a gate electrode 318 disposed over the dielectric region 316. The gate electrode 318 may be fabricated using materials such as heavily doped polysilicon of the first or second conductivity type or any other high conductive materials as per design feasibility and requirements. Further, the gate electrode 318 residing over the central portion of the JFET region 314 is etched suitably which results in a discontinuous structure of the gate electrode 318 over the central portion of the JFET region 314 (as shown in FIG. 3A). In other words, due to etching a portion of the gate electrode 318 residing over the central portion of the JFET region 314, the sidewalls 318a of the gate electrode 318 are offset by a distance from the central axis X-X'. This configuration ensures the gate electrode 318 overlaps at least on the first section 316b, and the second section of the dielectric region 316. The dielectric region 316 isolates the gate electrode 318 from at least the JFET region 314, the body region 306, the buried channel region 312 and the source region 308. Further, the gate electrode 318 may be configured with a uniform thickness. In one embodiment, the thickness of the dielectric region 316 may depend on a work function of a material used to fabricate the gate electrode 318.

The MOSFET 300 includes the source electrode 320 configured over the top surface 304a of the drift layer 304. The source electrode 320 partially overlaps at least the source region 308 and the base region 310 by forming an ohmic contact with at least the source region 308 and the base region 310. In one embodiment, the source electrode 320 configured on right and left of the central axis X-X' may be electrically coupled to form a unitary source electrode. Alternatively, in some embodiments, the source electrode 320 may be fabricated by using one or more metallic materials such that one metallic material may be coupled to the source region 308 and a separate base electrode (referring to FIG. 8) may be formed with a second metallic material that is coupled to the base region 310.

A drain electrode 322 is electrically coupled to the substrate layer 302. In other words, the drain electrode 322 is configured over a surface of the substrate layer 302 opposite to the drift layer 304. As such, the drain electrode 322 forms an ohmic contact with the substrate layer 302. In one embodiment, the gate electrode 318, the source electrode 320 and the drain electrode 322 may be a metallic electrode of polysilicon, Nickel or any other metallic material as per design feasibility and requirement.

In one embodiment, the MOSFET 300 may include, but not limited to, passivation layers, metal layers, pads, edge termination structures or other elements necessary for the proper functioning of the device (not shown in figures).

Figure 3B:
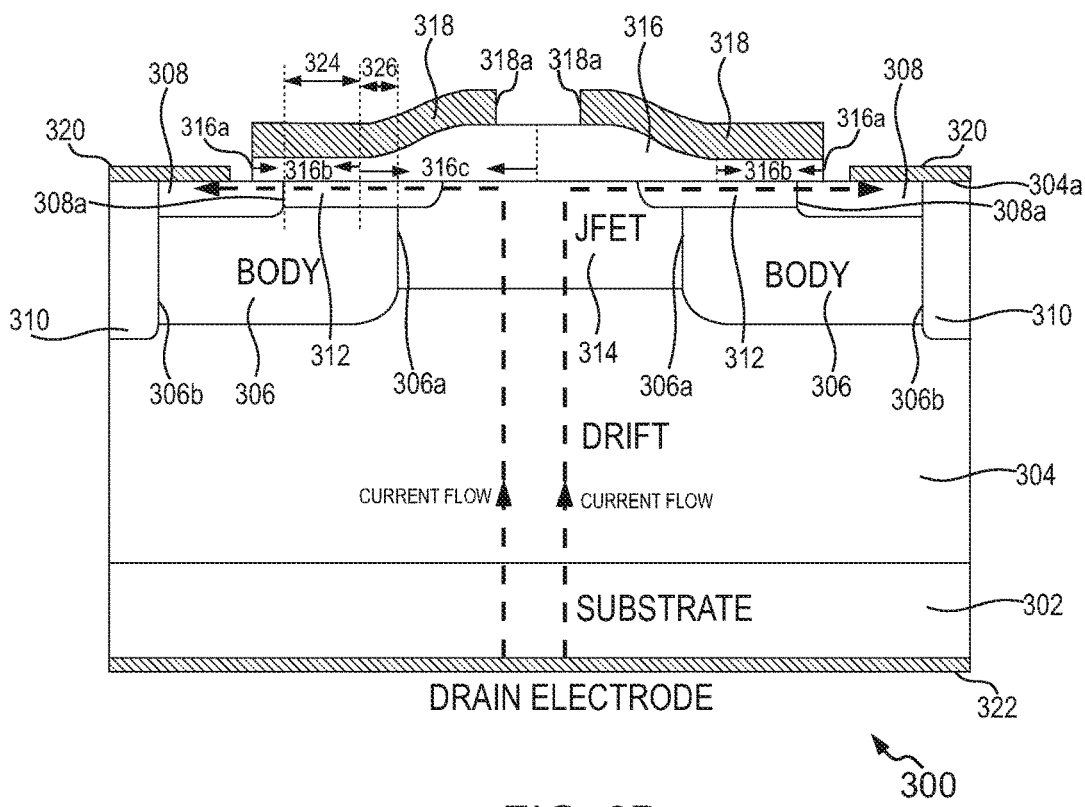
FIG. 3B is the cross sectional illustration of the unit cell structure of the vertical transistor device of FIG. 3A and depicting current flow operations and one or more regions, in accordance with an exemplary embodiment of the present disclosure.

FIG. 3B, in conjunction with FIG. 3A, illustrates a cross sectional illustration of the unit cell structure of the MOSFET 300 depicting current flow operations and one or more regions in the MOSFET 300.

When the MOSFET 300 is in the ON state and a positive bias voltage is applied to the gate electrode 318, a current (shown by dotted lines in FIG. 3B) is allowed to flow vertically from the drain electrode 322 through the substrate layer 302, the drift layer 304, the JFET region 314, the buried channel region 312, and the source region 308 to the source electrode 320. In this configuration, a channel region 324 is formed at a portion in the buried channel region 312 where the gate electrode 318 overlaps the buried channel region 312, the body region 306 and the first section 316b (i.e., "thin dielectric region") of the dielectric region 316. The buried channel region 312 creates a conductive channel for the current flow across the channel region 324. The buried channel region 312 reduces effects of the coulomb scattering (i.e., trapped charges) due to majority charge carriers present in the buried channel region 312 and is configured to form the conductive channel for flow of the electrons in the channel region 324. In a more illustrative manner, the buried channel region 312 is configured to separate electron flow in a vertical direction from the top surface 304a (i.e., "dielectric-semiconductor interface"). In one embodiment, the current flow may occur below a distance from the top surface 304a of about 1 nm to 200 nm. The buried channel region 312 also reduces a gate threshold voltage $V_{TH}$ required for the MOSFET 300 to switch from the OFF-state to the ON-state. If the threshold voltage is reduced below zero volts, a conductive channel is formed by the buried channel region 312 in the MOSFET 300 even without application of any gate bias, and therefore the MOSFET 300 may be referred to as a normally ON transistor. In one embodiment, the channel region 324 may have a width of about 100 nm to 1 μm.

Thus, the gate threshold voltage $V_{TH}$ can be controlled based on the thickness of the first section 316b (i.e., "thin dielectric region") of the dielectric region 316, charge density present in the buried channel region 312 and the body region 306 vertically under the gate electrode 318 in the channel region 324. Further, a reduced surface field (RE-SURF) region 326 is formed in the buried channel region 312 where a portion of the gate electrode 318 partially overlaps the second section 316c (i.e., "thick dielectric region") of the dielectric region 316, the buried channel region 312 and the body region 306. The RESURF region 326 may be of a width of about 50 nanometer to 500 nanometer. When a biasing voltage lower than the threshold voltage ($V_{TH}$) (i.e., the MOSFET 300 is in an OFF state) is applied to the gate electrode 318 to pinch off the channel region 324 and the drain electrode 322 is at a high bias voltage, the RESURF region 326 is configured to minimize a magnitude of electric field in the first section 316b (i.e., "thin dielectric region") and the JFET region 314, thereby preventing a premature rupturing of the dielectric region 316 and improving the reliability and performance of the MOSFET 300.

A further reduction of the magnitude of the electric field in the second section 316c of the dielectric region 316 is achieved by removing the gate electrode 318 above the central section of the JFET region 314, such that the inner sidewall 318a of the gate electrode 318 is separated from the central axis X-X' of the unit cell by some distance, which reduces coupling between the drain electrode 322 and the gate electrode 318 near the center of the JFET region. In one non-limiting example, the lateral separation between the inner sidewall 318a of the gate electrode 318 and the center of the JFET region can be between 0.2 microns and 1 microns. The drain-to-gate capacitance, or reverse transfer capacitance, is also thus reduced compared to a device where the gate electrode is continuous and extends throughout the thick section (i.e., "second section 316c") of the dielectric region 316. The benefit of the discontinuous nature of the gate electrode 318 is explained further with reference to FIG. 5D in detail.

Since the buried channel region 312 extends across the RESURF region 326, the doping concentration of the buried channel region 312 can be made high enough such that a conductive path is formed across the RESURF region 326 during the ON state of the MOSFET 300.

Thus, the RESURF region 326 is configured to control the electric field in the dielectric region 316 when the MOSFET 300 is in the OFF state. Further, the RESURF region 326 is configured to form the conductive channel for electron flow when the MOSFET 300 is in the ON state. The effect of the RESURF region 326 in the MOSFET 300 is explained further with reference to FIG. 5C in detail.

When a gate voltage lower than the threshold voltage ($V_{TH}$) is applied at the gate electrode 318 to pinch off the channel region 324, no current flows from the drain electrode 322 to the source electrode 320. However, a leakage current may flow from the drain electrode 322 to the source electrode 320 till a drain voltage ($V_D$) reaches a breakdown point/voltage of the MOSFET 300. For instance, magnitude of the leakage current may be between in a range of 1 picoampere to 10 microampere.

In one configuration, the MOSFET 300 may be an enhancement mode MOSFET device, such that the threshold voltage of the MOSFET is greater than zero volts. As such, when no gate voltage is applied at the gate electrode 318, there is no current flow between drain and source in the enhancement mode MOSFET device.

Figure 4:
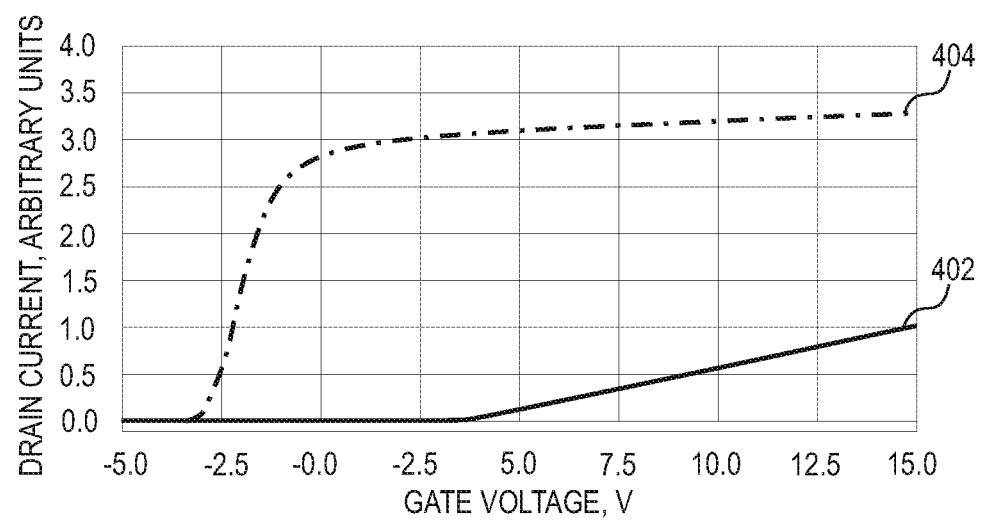
FIG. 4 illustrates a graph depicting variation of drain current flow due to a voltage applied at a gate electrode of the MOSFET device of FIG. 1 and the vertical transistor device of FIG. 3A.

FIG. 4 illustrates a graph depicting the simulated variation of drain current flow (i.e., drain current in normalized arbitrary units) as a function of a voltage applied at a gate electrode of the MOSFET device 100 (referring to FIG. 1) and MOSFET 300 (referring to FIG. 3). A drain voltage (e.g., 100 millivolts) is applied at the drain electrode for facilitating the current flow in the MOSFET device 100 and the MOSFET 300. Graph 402 represents variations in drain current versus applied gate voltage with regards to the MOSFET device 100. Graph 404 represents variations in drain current versus applied gate voltage with regards to the MOSFET 300.

In the graph 402, the MOSFET device 100 is turned ON by applying a gate voltage equal to or greater than a gate threshold voltage ($V_{TH}$) (i.e., 3.5V) at the gate electrode 116 of the MOSFET device 100. It is understood that the MOSFET device 100 at a fully rated gate voltage of 15V, the drain current of the MOSFET 100 is limited due to the effect of coulomb scattering in the MOSFET device 100 which impedes flow of electrons during the ON state. In normalized units, the current through the MOSFET 100 is 1 at when a voltage of 15V is applied at the gate electrode 116.

In the graph 404, the MOSFET 300 is turned ON by applying the gate threshold voltage ($V_{TH}$) of approximately −3 Volts through the gate electrode 318 of the MOSFET 300. As explained previously, the MOSFET 300 includes the buried channel region 312. The buried channel region 312 creates the conductive channel for the current flow across the channel region 324. The buried channel region 312 reduces the threshold voltage of the MOSFET 300 to below zero volts such that the MOSFET 300 is considered normally-ON. The buried channel region 312 also reduces effects of the coulomb scattering (i.e., trapped charges) due to majority charge carriers present in the buried channel region 312. In more illustrative manner, the buried channel region 312 is configured to separate lateral electron flow from the top surface 304a (i.e., dielectric interface). Due to this effect, the mobility of electrons in the channel region 324 is improved. In normalized units, the drain current in the MOSFET 300 when a gate voltage of 15V is applied to gate electrode 318 is 3.25.

Based on the simulation results, there is approximately 3.25 times higher drain current in the MOSFET 300 than the MOSFET device 100 when the same gate voltage is applied in the MOSFET device 100 and the MOSFET 300, as shown by the graph 404, associated with the MOSFET 300, in comparison with the graph 402, associated with the conventional MOSFET device 100.

As seen in the FIG. 4, the maximum drain current is about 3.25 times larger in the MOSFET 300 than the MOSFET device 100 (i.e., MOSFET without the buried channel) demonstrating the performance improvement during the ON state when the same gate voltage (for example, 15V) is applied. It is noted that the gate threshold voltage required for the MOSFET 300 to turn ON is approximately −3V, whereas the gate threshold voltage required for the MOSFET device 100 to turn ON is approximately +3.5V.

Figure 5A:
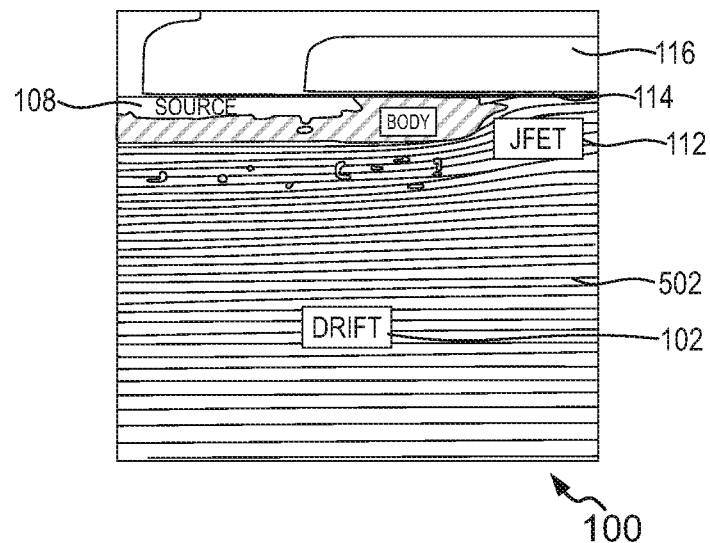
FIGS. 5A, 5B, 5C, and 5D illustrate electrical potential contours depicting in half unit cell of devices as shown in FIGS. 1, 2, and 3A.
Figure 5B:
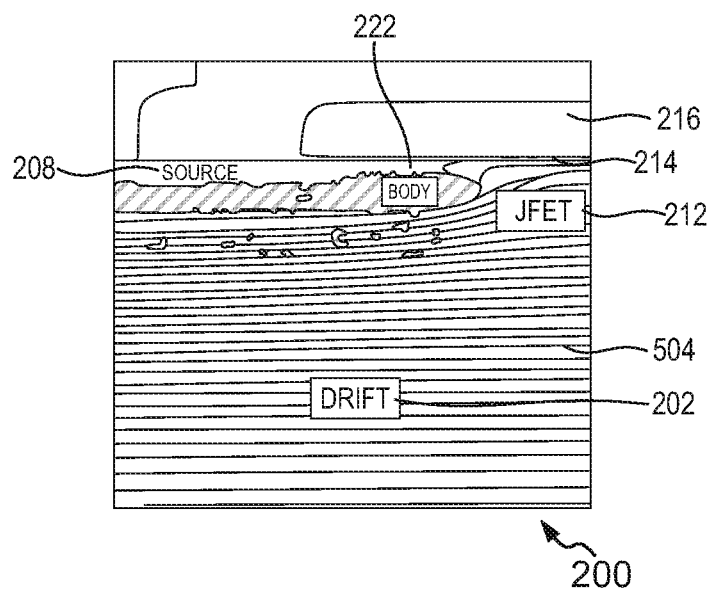
Figure 5C:
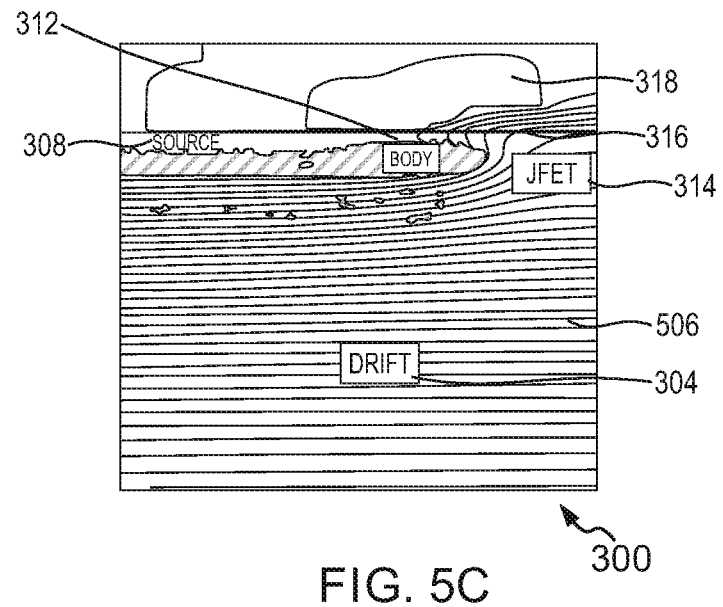

Referring now to FIGS. 5A, 5B, and 5C, electrical potential contours depicting in half unit cell of devices illustrated in FIGS. 1, 2, and 3A, respectively, are shown. A high drain voltage is applied at a drain electrode and a gate voltage less than the gate threshold voltage ($V_{TH}$) is applied at a gate electrode for these simulations so that the devices are normally in the OFF state. In one example, a drain voltage of 400V and a gate voltage of −8V are used in these simulations. Each potential contour represents a drop of 10V in the device. In general, electric potential contours also define electric field distribution in a MOSFET device. The density or space between the electric potential lines is determined by the electric field. In other words, closer the electric potential contours in a unit area, higher is the magnitude of electric field in the unit area, whereas the magnitude of electric field is lower when the electric potential contours are spaced apart in the unit area.

In the FIG. 5A, the P-type body region 106 is shown as a region with a hatched pattern (see 106 in FIG. 5A), which is connected to a zero potential. The P-type body region 106 is configured to act as a "shield" from high electric field for the dielectric region 114. In other words, due to the shielding effect, the body region 106 restricts flow of the electric potential contours 502 to the dielectric region 114 through the P-type body region 106. However, the magnitude of electric field in the dielectric region 114 increases farther away from an inner edge of the P-type body region 106, resulting a high electric field near a dielectric-semiconductor interface in the JFET region 112 and the dielectric region 114. Further, the electric potential contours 502 are more concentrated in the dielectric region 114 due to lower permittivity of the dielectric region 114 compared to the bulk semiconductor in the MOSFET device 100. Thus, an increase in the magnitude of electric field in the dielectric region 114 above a certain limit results in rupturing and/or degradation of the dielectric region 114 over time, reducing reliability of the MOSFET device 100.

According to the FIG. 5B, in the MOSFET device 200, the introduction of the N-type buried channel region 222 diminishes the shielding effect of the P-type body region 206 because of counter-dopant effect of the N-type buried channel region 222. As shown in the FIG. 5B, the electric potential contours 404 curve around to encroach inside the P-type body region 206. Due to the diminished shielding effect of the P-type body region 206, the density of the electric potential contours 504 within the dielectric region 214 increases thereby resulting an increase in the magnitude of electric field across the dielectric region 214. Therefore, the dielectric region 214 of the MOSFET device 200 has a high probability of rupturing or breakdown than the MOSFET device 100 because of the introduction of the buried channel region 222.

FIG. 5C shows electric potential contours 506 in the half unit cell of the MOSFET 300 is shown, in accordance with an embodiment of the present disclosure.

Referring back to the FIG. 3, in the MOSFET 300, the reduced surface field (RESURF) region 326 is introduced in the buried channel region 312 by bringing an edge of the thin dielectric region (i.e., "first section 316b") inside the inner edge 306a of the body region 306 by some distance. The RESURF region 326 may partially overlap with a gradient thickness section (i.e., "second section 316c") of the dielectric region 316. In other words, the RESURF region 326 is a portion in the buried channel region 312 where the gate electrode 318 overlaps with the buried channel region, the body region 306, and the second section of dielectric region 316. As the buried channel region 312 is doped with the first conductivity type dopants opposite to the body region dopants therefore the electric potential contours 406 tend to encroach inside the inner edge 306a of the body region 306 due to the counter-dopant effects. Thereafter, the electric potential contours 506 enter the gradient thickness section (i.e., "second section 316c") of the dielectric region 316 via the RESURF region 326 of the buried channel region 312. As shown in the FIG. 5C, due to gradient thickness profile of the dielectric region 316, the electric potential contours 506 flow laterally across the thicker dielectric region and are spaced apart from each other. In other words, due to the graded thicker profile of the dielectric region 316, the electric potential contours 506 are spaced apart in the second section 316c of the dielectric region 316, thereby, the magnitude of electric field across the dielectric region 316 is also reduced. Further, a voltage stress on the first section 316b of the dielectric region 316 also decreases because of the potential drop in the RESURF region 326. Therefore, due to combined effect of reduced voltage stress on the first section 316b and the electric potential contours 506 spaced apart in the second section 316c, the magnitude of electric field across the dielectric region 316 is reduced. Thus, the RESURF region 326 and a gradual step thickness profile of the dielectric region 316 prevent premature rupturing of the dielectric region 316 and enhance reliability and performance of the MOSFET 300.

Figure 5D:
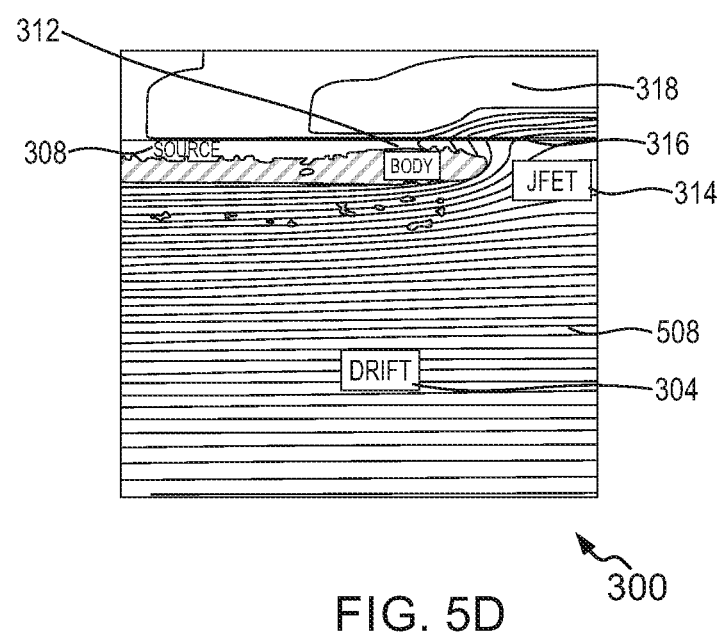

Referring now to FIG. 5D, electric potential contours 508 in half unit cell of a MOSFET device similar to the MOSFET 300 (as shown in FIG. 3A) except that in the MOSFET device, and the gate electrode 318 formed in a continuous manner to overlap the entire thick dielectric region (i.e., "second section 316c") of the dielectric region 316, are shown. In other words, the gate electrode 318 is made continuous to overlap the entire section of the thick dielectric region (i.e., "second section 316c") of the dielectric region 316.

The potential contours of the MOSFET device in the FIG. 5D also shows benefits of the RESURF region 326 to reduce the electric field in the thin dielectric region of the dielectric region. Furthermore, when compared to the potential contours shown in the FIG. 5C, it is observed that the electric field crowding near the center of the JFET region 314 is increased due to the presence of the gate electrode 318 over the entire section of the thick dielectric region (i.e., "second section 316c"). In other words, a comparison of potential contours in FIGS. 5C and 5D, shows the benefits of adding an inner sidewall 318a to the gate electrode 318 of MOSFET 300, which further reduces the magnitude of electric field in the thick dielectric region of the dielectric region 316c when the MOSFET is in OFF state, over and above the magnitude of reduction provided by the RESURF region 326.

Figure 6:
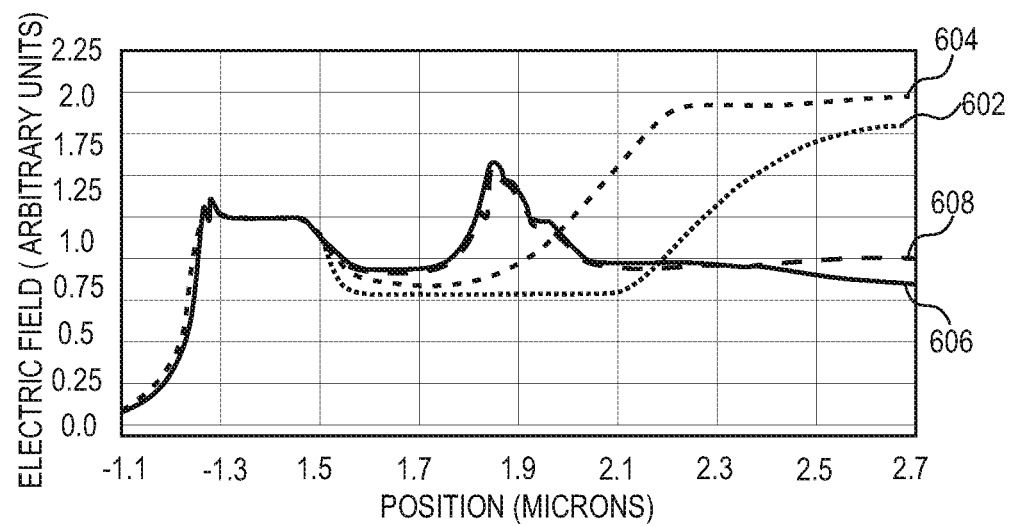
FIG. 6 illustrates a graph depicting variation of electric field at a dielectric-semiconductor interface along a lateral direction of devices as shown in FIGS. 1, 2, and 3A.

FIG. 6 illustrates a graph depicting variation of electric field at a top surface of the drift layer (i.e., dielectric-semiconductor interface) along a lateral direction of devices as shown in FIGS. 5A, 5B, 5C and 5D, respectively. A high drain voltage is applied at a drain electrode and a gate voltage less than the gate threshold voltage ($V_{TH}$) is applied at a gate electrode for these simulations so that the devices 100, 200, and 300 are normally in the OFF state. In one example, a drain voltage of 400V and a gate voltage of −8V are used in these simulations. As illustrated in FIG. 6, electric field intensity distribution at the dielectric-drift layer interface of the MOSFET devices 100 and 200 and the vertical transistor device 300 is plotted against a lateral direction starting from an edge portion of the dielectric-semiconductor interface. The position axis (i.e., X-axis) represents a lateral distance starting from an edge of the unit cell to a center point of the unit cell. The electrical field axis (i.e., Y-axis) represents magnitude of electric field in the dielectric near the dielectric-semiconductor interface of the device. Graph 602 represents a case when the MOSFET device 100 (i.e., MOSFET device without buried channel) is turned off and a high drain voltage is applied. Graph 604 represents a case when the MOSFET device 200 (i.e., MOSFET device with buried channel) is turned off and a high drain voltage is applied. In other words, the Graphs 602 and 604 represent the case when the devices are configured according to the structure shown in FIGS. 1 and 2, respectively. Graph 606 represents a case when the device is configured according to the structure shown in FIG. 3A. Graph 608 represents a case when the device is configured to the structure shown in FIG. 5D, which represents a device that is similar to the device shown in FIG. 3A but with a continuous gate electrode that extends throughout the thick dielectric region (i.e., "second section 316c") of the dielectric region 316.

As seen in the FIG. 6, in the graph 602, electric field starts increasing at the dielectric-semiconductor interface after crossing the body region 106 and the electric field overshoots as electric field lines enters into the dielectric region 114. Further, the body region 106 is at zero potential therefore, the body region 106 acts as a shield from high electric field for the dielectric region 106. However, in the graph 604, magnitude of the electric field overshoots drastically due to introduction of the buried channel region 222 in the body region 206. Due to counter-dopant effect of the buried channel region 222, the shielding effect of the body region 206 diminishes, resulting a predominant electric field at the dielectric-semiconductor interface. Hence, by bringing the buried channel region 222 in the body region 206, the dielectric region 214 experiences a peak electric field which may lead to malfunction the MOSFET 200 after a certain limiting value of the electric field.

In the graph 606, a peak of the electric field at the top surface 304a (i.e., dielectric-semiconductor interface) is lower than the peak electric field present in the MOSFET 200. As illustrated in the FIG. 3A, the MOSFET 300 has a gradual step thickness profile of the dielectric region 316. The dielectric region 314 includes a thin dielectric region (i.e., "first section 316b") and a thick dielectric region (i.e., "second section 316c"). The thick dielectric region (i.e., "second section 316c") has a gradient thickness portion which starts from the thin dielectric region. As seen in the graph 604, the electric field in the dielectric region 214 is increased because of the introduction buried channel region 222 in conventional devices (i.e., MOSFET device 200). In the present disclosure, as shown in FIG. 3A, the buried channel region 312 is implanted in such a manner so that the buried channel region 312 overlaps with the thin dielectric region (i.e., "first section 316b") and partially with thick dielectric region (i.e., "second section 316c"). The portion of the buried channel region 312 which overlaps with the thick dielectric region (i.e., "second section 316c") and the gate electrode 318 is called as a RESURF region 326. The RESURF region 326 reduces a voltage stress at the thin dielectric region (i.e., "first section 316b"). Further, increased separation between the gate electrode 318 and the dielectric semiconductor interface due to the presence of the thick dielectric region also reduces the electric field in the dielectric region 316 farther away from the body region 306.

In the graph 608, the RESURF region 326 reduces the electric field in the dielectric semiconductor interface in a similar fashion as described in the case of graph 606. Further, it is seen that due to the presence of the gate electrode 318 in a center section of the JFET region 314, the electric field (see, 608) in the center section shows an increase compared to graph 606. Graphs 606 and 608 illustrate the impact of removing the gate electrode 318 in the center section of the JFET region 314 to form an inner sidewall 318a to the gate electrode 318 to reduce the electric field in the center section of the JFET region 314 and prevent premature rupture of dielectric region 314 in the MOSFET 300.

Referring now to FIGS. 7A-7G, a process for manufacturing the MOSFET 300 (as shown in FIG. 3A) is illustrated, in one exemplary embodiment of the present disclosure. Through the process, exemplary materials, doping types, doping levels, structure dimensions, and the selected alternatives are outlined, these aspects are merely illustrative, and the concepts disclosed herein and the claims that follow are not limited to these aspects. The sequence of operations of the process for manufacturing may not be necessarily executed in the same order as they are presented.

Figure 7A:
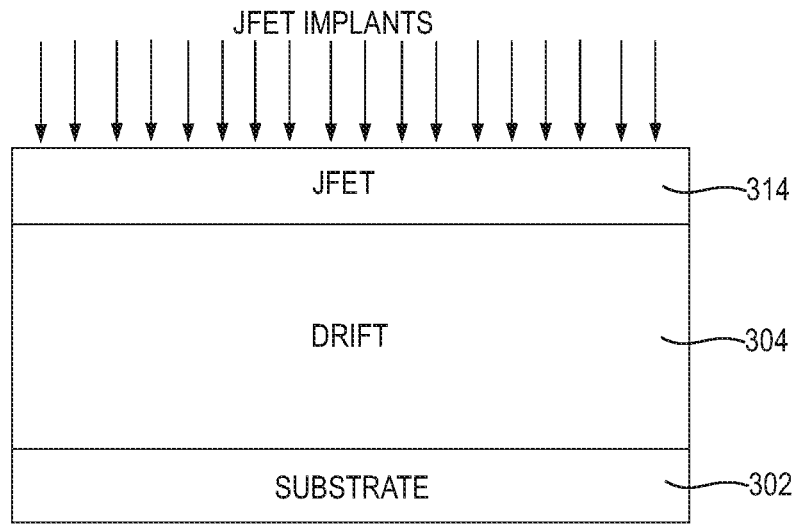
FIGS. 7A-7G, collectively, illustrate a process for manufacturing the vertical transistor device of FIG. 3A, in accordance with an exemplary embodiment of the present disclosure.

As shown in FIG. 7A, the substrate layer 302 of the first conductivity type is provided. The substrate layer 302 may be composed of heavily doped SiC crystal or any other semiconductor material as per design feasibility and requirement. In one embodiment, the substrate layer 302 may be a polytype of either 4H-SiC, 6H-SiC or 3C-SiC. The drift layer 304 of the first conductivity type including the top surface 304a is formed on the substrate layer 302. The drift layer 304 may be formed by an epitaxial growth technique. Further, blocking voltage and/or maximum voltage rating of the MOSFET 300 depends on thickness and doping concentration of the drift layer 304. The drift layer 304 may be fabricated by using semiconductor materials such as SiC, Silicon, GaN or any other materials as per design feasibility and requirement.

The JFET region 314 may be formed within the drift layer 304 of the first conductivity type (e.g., N-type SiC) by selective implantation. The JFET region 314 may be implanted in the drift layer 304 either by using a mask or without using a mask. In addition, the JFET region 314 may be incorporated in the drift layer 304 either by implantation technique, epitaxial growth or diffusion technique.

Figure 7B:
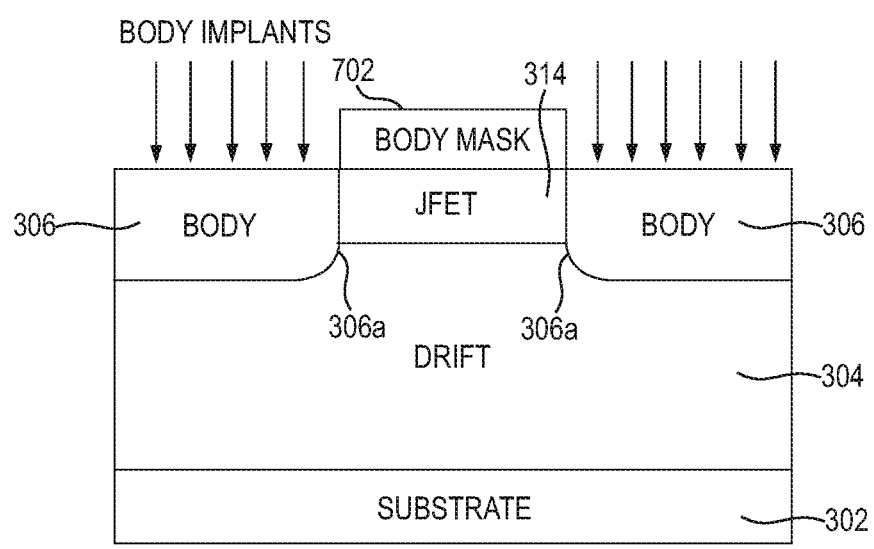

As shown in FIG. 7B, a process of forming the body region 306 on the drift layer 304 is shown. A body mask 702 is formed on a central portion of the JFET region 314 which facilitates symmetrical implantation of the body region 306 within the drift layer 304. The body mask 702 may be formed using a material such as photoresist, oxide, polysilicon or nitride. The body region 306 may be doped with the second conductivity type (e.g., P-type dopants) and implanted within the drift layer 304 such that the JFET region 314 is positioned in between the body regions 306. The body regions 306 may be formed using materials such as implanted Aluminum or any other materials.

Figure 7C:
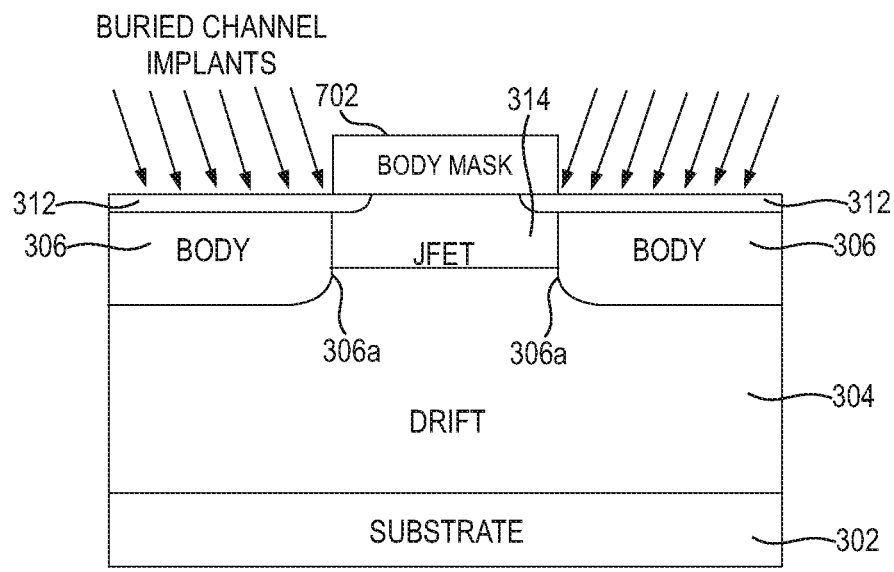

As shown in FIG. 7C, a process of forming the buried channel region 312 in the MOSFET 300 is illustrated. The body mask 702 is patterned on the central portion of the JFET region 314. In one embodiment, the buried channel region 312 of the first conductivity type may be formed using a tilted implantation technique which results the buried channel region 312 to be sandwiched between the body region 306 on a first side of the buried channel region 312 and the dielectric region 316 on a second side opposite to the first side. Due to the tilted implantation, a portion of the buried channel region 312 extends beyond the body region 306 into the JFET region 314. In one embodiment, the buried channel region 312 may be formed by contraction of the body mask 702 which results in aforementioned structural configuration of the buried channel region 312 in a self-aligned manner. In another embodiment, the body mask 702 may be stripped prior to formation of the buried channel region 312 and a separate mask may be formed and patterned before implanting the buried channel region 312, such that the mask has a fixed offset to the body region 306.

Figure 7D:
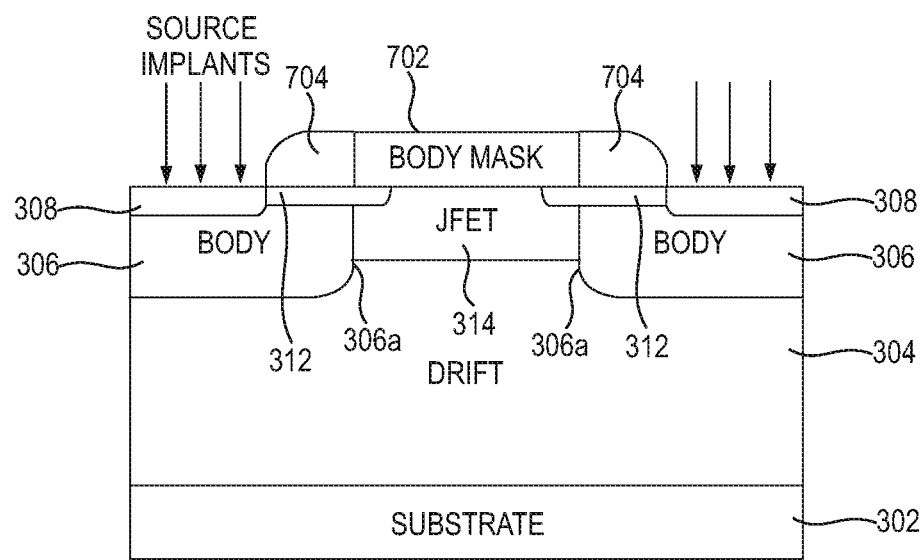

As shown in FIG. 7D, a process of forming the source region 308 in the MOSFET 300 is illustrated. The body mask 702 is patterned over the JFET region 314. Further, a sidewall spacer 704 is formed on the sidewall of the body mask 702. The role of the sidewall spacer 704 is to create an offset between the inner edge 306a of the body region 306 and an edge of a source mask that is not dependent on alignment. The sidewall spacer 704 is used to create the source region 308 that is self-aligned to the body region 306 by ion-implantation. The sidewall spacer 704 has a lateral length such that the sidewall spacer 704 covers the buried channel region 312. Then, the first conductivity type dopants (e.g., "N-type dopants") are implanted within the body region 306 using selective implantation. The N-type dopants may be, for example, nitrogen and/or phosphorus, however, other N-type dopants may also be used. In one embodiment, the source region 308 may be doped to provide a carrier concentration of at least from about $1 \times 10^{18}$ cm$^{-3}$ to about $1 \times 10^{21}$ cm$^{-3}$ and a depth of about 0.1 to 0.5 μm. Thus, the source region 308 laterally extends into the body region 306 where an edge of the implanted source region 308 is in contact with the buried channel region 312.

Figure 7E:
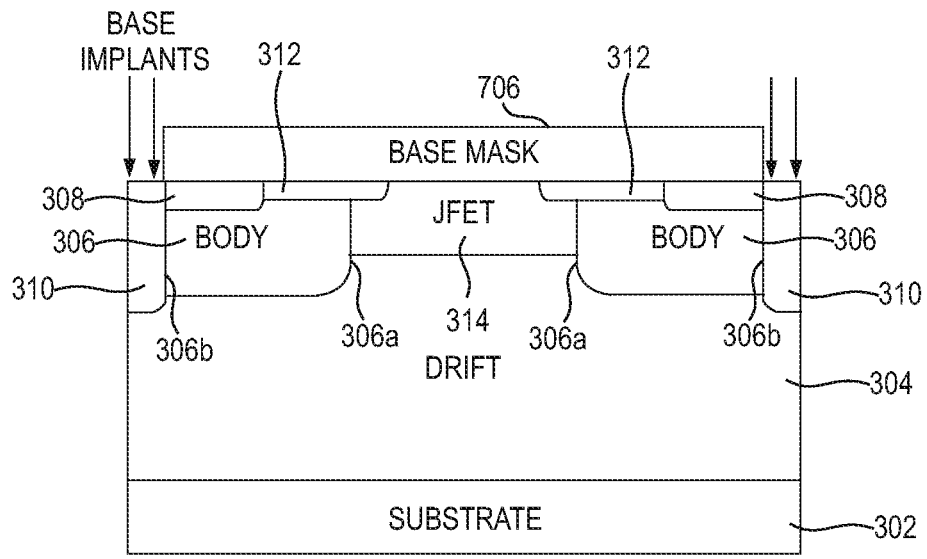

As shown in FIG. 7E, a process of forming the base region 310 in the MOSFET 300 is illustrated. The body mask 702 is stripped prior to implanting the base region 310 and a base mask 706 is formed and patterned over at least on the body region 306 and the JFET region 314. The base mask 706 is utilized to form the base region 310 of the second conductivity type at an end of the top surface 304 of the drift layer 304 such that the base region 310 extends vertically from the top surface 304a into the drift layer 304. The base region 310 of the second conductivity type may be doped with materials such as Aluminum, Boron or any other materials as per design feasibility and requirement. The function of the base region 310 is to link the body region 306 to an electrode through an ohmic contact.

Thereafter, the base mask 706 may be stripped and the structure described above with reference to FIGS. 7A-7E may be capped with a protective layer (e.g., "carbon cap") prior to an annealing process. The protective layer may consist primarily of Carbon material and configured to protect the body regions 306, the source region 308, and the JFET region 314 during the annealing process. The structure is annealed at a temperature of about 1500 degree Celsius to about 1700 degree Celsius for a duration of about 30 seconds to 24 hours to activate the implanted regions. Upon completion of the annealing process, the protective layer may be stripped off and the dielectric region 316 may be deposited over the top surface 304a of the drift layer 304 which is explained further with reference to FIG. 7F.

Figure 7F:
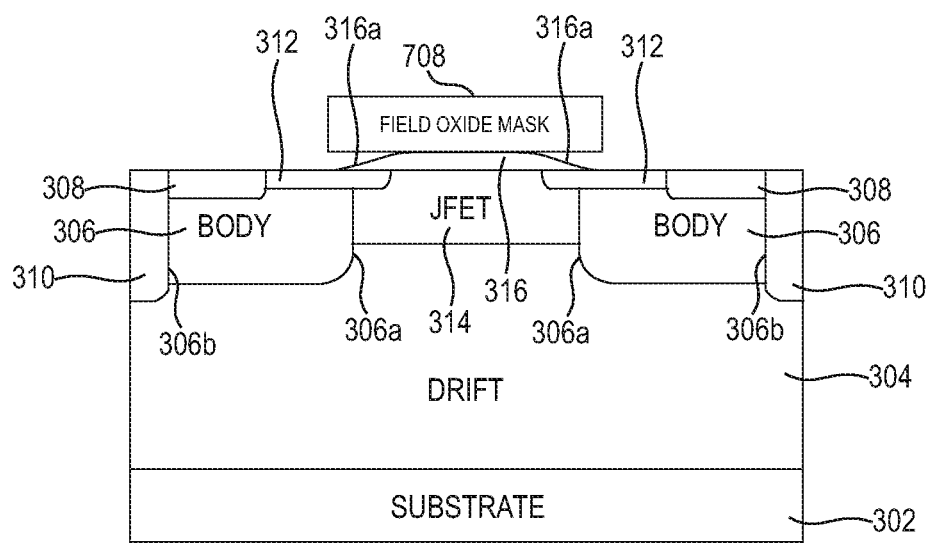

As shown in FIG. 7F, a process of forming the dielectric region 316 in the MOSFET 300 is illustrated. In one example, the dielectric region 316 may be referred to as an oxide region. The dielectric region 316 may be fabricated by using materials such as silicon dioxide ($SiO_2$), aluminum oxide ($Al_2O_3$), magnesium oxide (MgO) or any other materials as per design feasibility and requirement.

At first, a thick oxide layer is deposited on the top surface 304a of the drift layer 304 by a thermal or plasma process or a combination of the two. Thereafter, an isotropic etch is utilized to create a slope in sidewalls of the thick oxide layer. In one non-limiting example, the thick oxide layer is etched by a mask 708 using the isotropic etch technique which results in a slope or tapered profile in sidewalls of the dielectric region 316. This etched thick oxide layer conforms to the second section 316c of the dielectric region 316. Upon formation of the second section 316c, a thin oxide layer may be formed using thermal oxidation or by depositing oxide to form a first section 316b of the dielectric region 316 adjacent to the second section 316c overlapping with at least the body region 306. The first section 316b of the dielectric region 316 corresponds to a thin oxide layer. Thus, structure of the dielectric region 316 is formed such that a tapered profile of the thick oxide layer (i.e., "second section 316c") is in contact with the thin oxide layer (i.e., "the first section 316b").

In one embodiment, the deposition of the dielectric region 316 (e.g., oxide region) partially may overlap with the source region 308, the buried channel region 312, and the JFET region 314. Further, the dielectric region 316 is relatively thick throughout the second section 316c and the dielectric region 316 is relatively thin throughout the first section 316b.

Figure 7G:
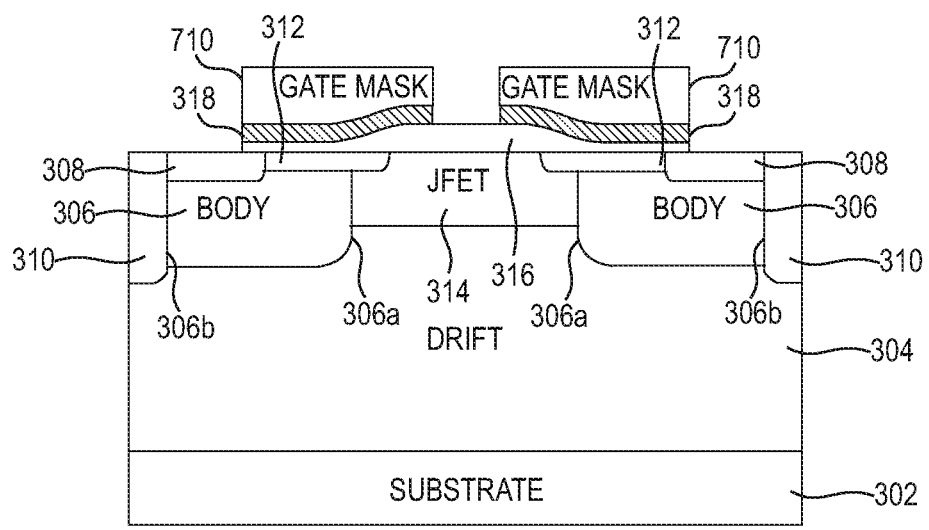

As shown in FIG. 7G, a process of forming the gate electrode 318 in the MOSFET 300 of FIG. 3 is illustrated. The gate electrode 318 is formed over the dielectric region 316. The gate electrode 318 is etched using a gate mask 710 which is formed upon deposition of the gate electrode 318. The etching of the gate electrode 318 using the gate mask 710 results a discontinuous structure of the gate electrode 318 (e.g., as shown in FIG. 3A). The gate electrode 318 may be formed using materials such as polysilicon and/or other suitable contact material may be used as per design feasibility and requirement. Upon forming the gate electrode 318, the source electrode 320 may be formed over the top surface 304a of the drift layer 304, such that the source electrode 320 is offset from the sidewalls of the gate electrode 318. The drain electrode 322 may be formed on the substrate layer 304. In one embodiment, the drain electrode 322 and the source electrode 320 may be formed by using either evaporative deposition technique, sputtering technique or other such techniques as per the requirement.

Figure 8:
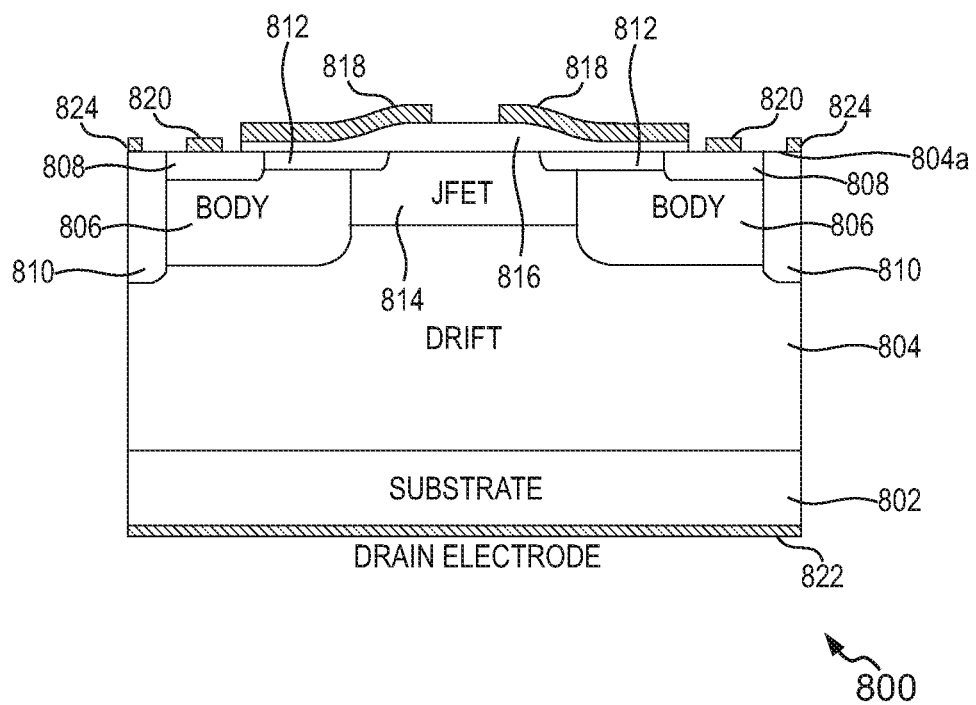
FIG. 8 is a cross sectional illustration of the unit cell structure of a vertical transistor device, in accordance with another exemplary embodiment of the present disclosure.

FIG. 8 is a cross sectional illustration of a unit cell structure of a vertical transistor device 800, in accordance with an exemplary embodiment of the present disclosure. The vertical transistor device 800 may be formed by a plurality of unit-cells and some structural elements. For ease of illustration, a single unit cell of the vertical transistor device 800 will be described. In one embodiment, the vertical transistor device 800 is a Metal-Oxide Semiconductor Field-Effect Transistor (MOSFET) device and even more preferably a Silicon Carbide (SiC) MOSFET device. For ease of understanding, the term "vertical transistor device 800" is hereinafter interchangeably referred to as "MOSFET 800" throughout the description.

The MOSFET 800 includes a substrate layer 802, a drift layer 804 formed on the substrate layer 802, one or more body regions 806 implanted in a surface of the drift layer 804 opposite the substrate layer 802, and a source region 808 implanted in the body region from a top surface 804a of the drift layer 804. The MOSFET 800 further includes a buried channel region 812 implanted from the top surface 804a of the drift layer 804 into each body region 806, a junction field effect transistor (JFET) region 814 between each body region 806. The MOSFET 800 also includes a dielectric region 816 disposed over the top surface 804a with a gradual step thickness profile, a base region 810 disposed from the top surface 804a adjacent to the body region 806 opposite the JFET region 814, a gate electrode 818, a source electrode 820, and a drain electrode 822.

The structure of the MOSFET 800 is similar to the structure of the MOSFET 300 (as shown in FIG. 3A) except that the MOSFET 800 may include a base electrode 824 disposed above the top surface 804a and overlapped with the base region 810. Further, the source electrode 820 does not overlap with the base region 810. In other words, the base electrode 824 and the source electrode 820 may be isolated from each other. The base electrode 824 may be fabricated by using one or more metallic materials. As such, a breakdown voltage between a junction of the source region 808 and the base region 810 may be greater than 10 Volts.

In one embodiment, the base electrode 824 may be used as a shielding electrode or a shielding terminal in a cascode configuration. For instance, in the cascode configuration, the MOSFET 800 including the base electrode 824 (i.e., shielding electrode) may be configured to minimize a transient voltage during a switching transition and capacitance value of the cascode configuration. In addition, in this configuration, the MOSFET device 800 may be referred to as a four terminal MOSFET device.

Figure 9:
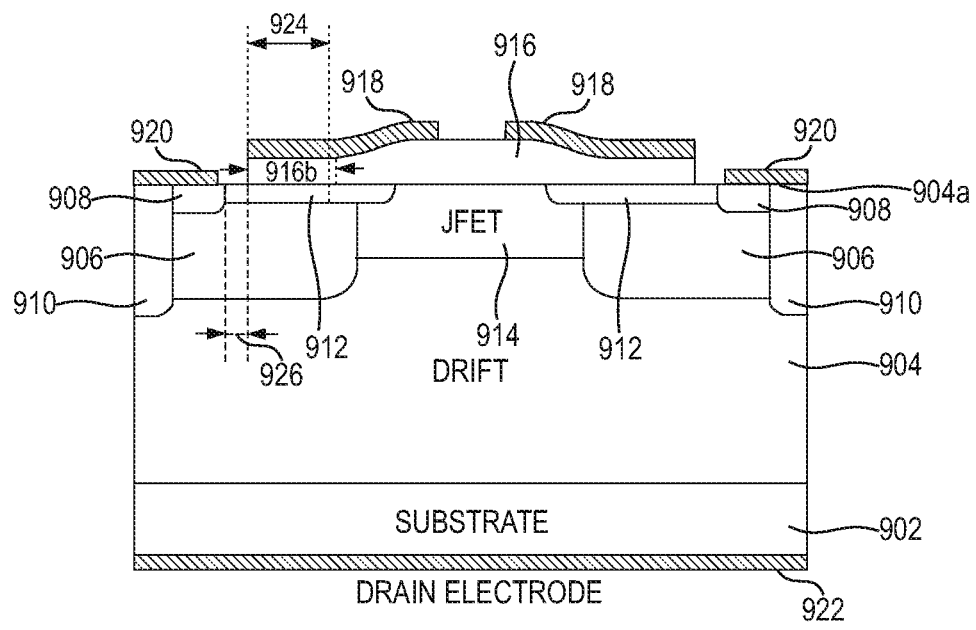
FIG. 9 is a cross sectional illustration of a unit cell structure of a vertical transistor device, in accordance with another exemplary embodiment of the present disclosure.

FIG. 9 is a cross sectional illustration of a unit cell structure of a vertical transistor device 900, in accordance with an exemplary embodiment of the present disclosure. The vertical transistor device 900 may be formed by a plurality of unit-cells and some structural elements. For ease of illustration, a single unit cell of the vertical transistor device 900 will be described. In one embodiment, the vertical transistor device 900 is a Metal-Oxide Semiconductor Field-Effect Transistor (MOSFET) device and even more preferably a Silicon Carbide (SiC) MOSFET device. For ease of understanding, the term "vertical transistor device 900" is hereinafter interchangeably referred to as "MOSFET 900" throughout the description.

The MOSFET 900 includes a substrate layer 902, a drift layer 904 on the substrate layer 902, one or more body regions 906 implanted into the drift layer 904 opposite the substrate layer 902, and a source region 908 implanted in the body region from a top surface 904a of the drift layer 904. The MOSFET 900 further includes a buried channel region 912 implanted from the top surface 904a of the drift layer 902 into each body region 906, and a junction field effect transistor (JFET) region 914 between each body region 906. The MOSFET 900 also includes a dielectric region 916 disposed over the top surface 904a with a gradual step thickness profile, a base region 910 disposed from the top surface 904a adjacent to the body region 906 opposite the JFET region 914, a gate electrode 918, a source electrode 920, and a drain electrode 922.

The structure of the MOSFET 900 is similar to the structure of the MOSFET 300 (as shown in FIG. 3A) except that a portion of the buried channel region 912 near the source region 908 of the MOSFET 900 does not overlap with the gate electrode 918.

In particular, the portion (see, 926 in FIG. 9) of the buried channel region 912 does not overlap with a first section 916b (i.e., "thin dielectric region") of the dielectric region 916 and the gate electrode 918. Moreover, the portion of the buried channel region 912 does not simultaneously overlap with the dielectric region 916 and the gate electrode 918, may be referred to as a source ballast region 926. As such, the source ballast region 926 is a region present in the buried channel region 912 between an edge of the source region 908 and an edge of a channel region 924 which is closer to the edge of the source region 908. In one embodiment, the source ballast region 926 may have a length of about 100 nm to 500 nm.

The source ballast region 926 may act as a source resistance in the MOSFET 900. Thus, a combined resistance of the source region 908 and the source ballast region 926 results and increase in a magnitude of source resistance in the MOSFET 900.

An effective gate to source voltage ($V_{GS}$) may be reduced due to the increase in a magnitude of source resistance in the MOSFET 900. In other words, the gate to source voltage ($V_{GS}$) may be reduced by value equal to the current times the resistance in the source ballast region 926. Further, a magnitude of saturation current (hereinafter referred as 'current $I_{DSAT}$') inversely depends on the square of the channel length of the channel region 924. Thus, the magnitude of current $I_{DSAT}$ of the MOSFET 900 may also be reduced. Furthermore, the magnitude of current $I_{DSAT}$ through the MOSFET 900 may be computed using the following equation (Eq. 1).

$$\text{Saturation current, } I_{DSAT} = k^*(V_{DRIVE} - V_{TH})^2 \quad \text{(Eq. 1)}$$

Wherein,
'k' is a proportionality constant that depends on material and structural properties of the MOSFET 900,
'$V_{DRIVE}$' is a drive voltage, which is the effective voltage $V_G$ (gate-to-source voltage) between the gate electrode 918 and the edge of the channel region 924 closer to the source region 908, and
'$V_{TH}$' is a gate threshold voltage.
As such, magnitude of the drive voltage $V_{DRIVE}$ may be computed using the following equation (Eq. 2).

$$V_{DRIVE} = V_{GS} - I_{DSAT}^* R_B \quad \text{(Eq. 2)}$$

Wherein,
$R_B$ is a resistance of the source ballast region 926.
Thus, effective magnitude of current $I_{DSAT}$ of the MOSFET 900 may be computed using the equation (Eq. 3).

$$I_{DSAT} = k^*(V_{GS} - I_{DSAT}^* R_B - V_{TH})^2 \quad \text{(Eq. 3).}$$

This structural configuration of the MOSFET 900 ensures a magnitude of the voltage $V_{DRIVE}$ to decrease when the magnitude of current $I_{DSAT}$ increases, thus creating a self-limiting effect. The source ballast region 926 may act as a negative feedback in the MOSFET 900 to limit the saturation drain current $I_{DSAT}$ flowing through the channel region 924. This is especially beneficial to limit the current flowing through devices in harsh situations, such as short circuit events.

In a more illustrative manner, the negative feedback provided by the source ballast region 926 helps to improve short-circuit ruggedness in MOSFET devices by reducing the saturation drain current, and thus limiting the power dissipation in the device. Thus, time-to-breakdown of the MOSFET 900 during any short-circuit conditions may be extended.

Figure 10A:
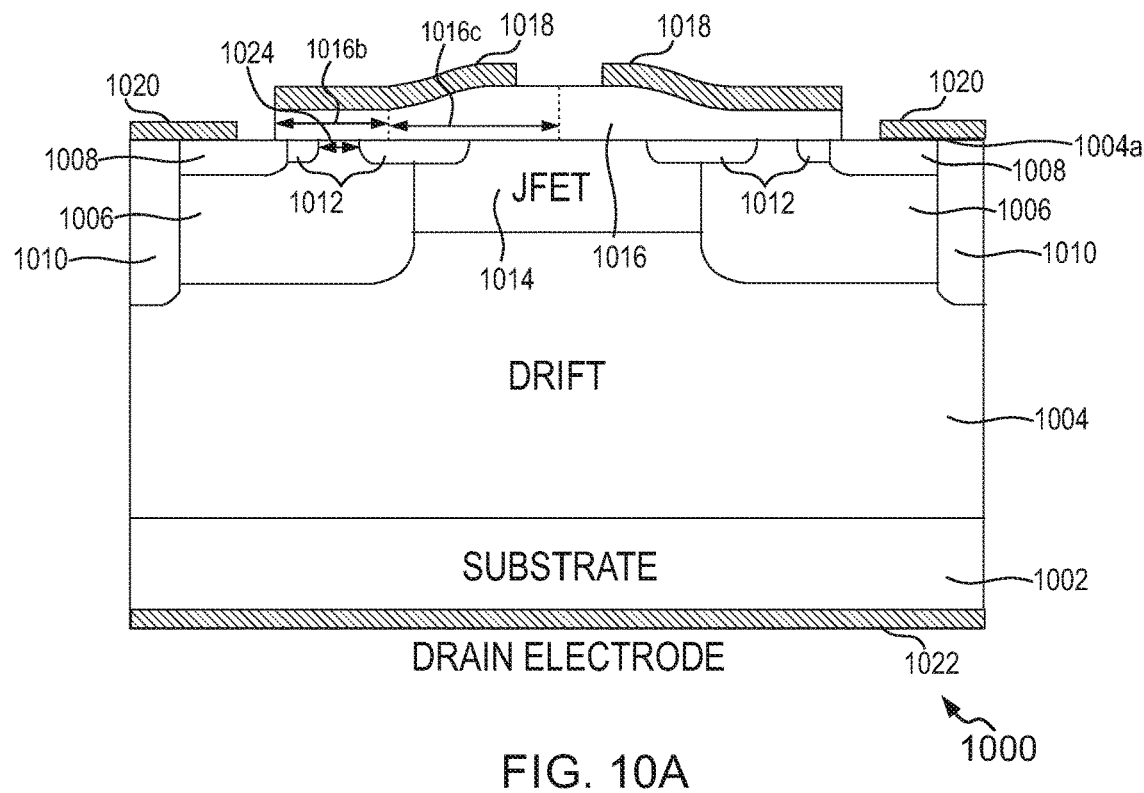
FIG. 10A is a cross sectional illustration of a unit cell structure of a vertical transistor device, in accordance with another exemplary embodiment of the present disclosure.

FIG. 10A is a cross sectional illustration of a unit cell structure of a vertical transistor device 1000, in accordance with an exemplary embodiment of the present disclosure. The vertical transistor device 1000 may be formed by a plurality of unit-cells and some structural elements. For ease of illustration, a single unit cell of the vertical transistor device 1000 will be described. In one embodiment, the vertical transistor device 1000 is a Metal-Oxide Semiconductor Field-Effect Transistor (MOSFET) device and even more preferably a Silicon Carbide (SiC) MOSFET device.

For ease of understanding, the term "vertical transistor device 1000" is hereinafter interchangeably referred to as "MOSFET 1000" throughout the description. In one embodiment, the MOSFET 1000 is a normally-off transistor device.

The MOSFET 1000 includes a substrate layer 1002, a drift layer 1004 on the substrate layer 1002, one or more body regions 1006 implanted into the drift layer 1004 opposite the substrate layer 1002, and a source region 1008 implanted in the body region 1006 from a top surface 1004a of the drift layer 1004. The MOSFET 1000 further includes a buried channel region 1012 implanted from the top surface 1004a of the drift layer 1004 into each body region 1006, and a junction field effect transistor (JFET) region 1014 between each body region 1006. The MOSFET 1000 also includes a dielectric region 1016 disposed over the top surface 1004a with a gradual step thickness profile, a base region 1010 disposed from the top surface 1004a adjacent to the body region 1006 opposite the JFET region 1014, a gate electrode 1018, a source electrode 1020, and a drain electrode 1022.

The structure of the MOSFET 1000 is similar to the structure of the MOSFET 300 (as shown in FIG. 3A) except that a portion of the buried channel region 1012 overlapped with a thin dielectric region (i.e., "a first section 1016b") of the dielectric region 1016 is interrupted.

In general, to create a normally-off transistor device, the N-type channel region should include a normally-off region with the opposite conductivity type (e.g., P-type dopants) doping close to the top surface (see, 1004a). So, to create the normally-off region, the buried channel region 1012 needs to be interrupted in the channel region (under the thin dielectric region). In a region 1024 where the buried channel region 1012 is interrupted, electrons flow closer to a dielectric-semiconductor interface (i.e., top surface 1004a), thereby a channel mobility of the MOSFET 1000 is reduced. Moreover, in the region 1024 where the buried channel region 1012 is interrupted, a conductive channel is not formed without application of a bias voltage to the gate electrode 1018, resulting the region 1024 to be a normally-off channel region. Further, the normally-off channel region 1024 may be referred to as an inversion channel region in the MOSFET 1000. Since, the mobility of the inversion channel is low and the resistance is high (comparable to conventional MOSFET devices without a buried channel), the inversion channel region 1024 should be as short as possible in a lateral direction. In one embodiment, a length of the inversion channel region 1024 may be of about 100 nm to 250 nm. In addition, due to the inversion channel, the magnitude of a gate threshold voltage $V_{TH}$ increases and becomes greater than zero, resulting in MOSFET 1000 being the normally-OFF transistor device.

Further, due to reduced length of the inversion channel region 1024, the gate threshold voltage ($V_{TH}$) of the MOSFET 1000 may be reduced for a higher value of a drain voltage $V_D$ applied through the drain electrode 1022 thereby resulting a premature turning-on of the MOSFET 1000 (referred to as Drain-induced barrier lowering (DIBL) effect). Further, due to the DIBL effect, the premature turning-on of the MOSFET 1000 may also result in increased leakage current, or reduced breakdown voltage thus degrading the voltage rating of the MOSFET 1000.

To counter the DIBL effect, a reduced surface field (RESURF) region is formed in the buried channel region 1012 where a portion of the gate electrode 1018 overlaps a second section 1016c of the dielectric region 1016 and the buried channel region 1012 (as explained with reference to FIG. 5C), and consequently at the edge of the inversion channel region 1024. Due to presence of the RESURF region in the MOSFET 1000, a voltage is reduced at an edge of the inversion channel region 1024. The RESURF region is therefore effective in reducing the drain induced barrier lowering (DIBL) effect in the MOSFET 1000.

In one embodiment, to create the region 1024 where the buried channel region 1012 is interrupted, a dedicated mask is used while implanting the buried channel region 1012 into the drift layer 1004. The dedicated mask is configured to block buried channel implants in a region that overlaps with the thin dielectric region (i.e., "the first section 1016b") and the gate electrode 1018. In this scenario, a length of the inversion channel region 1024 is based on a dimension of the dedicated mask. Therefore, channel length is not dependent on any alignment of any other implanted layers or regions and is defined in a self-aligned manner.

Figure 10B:
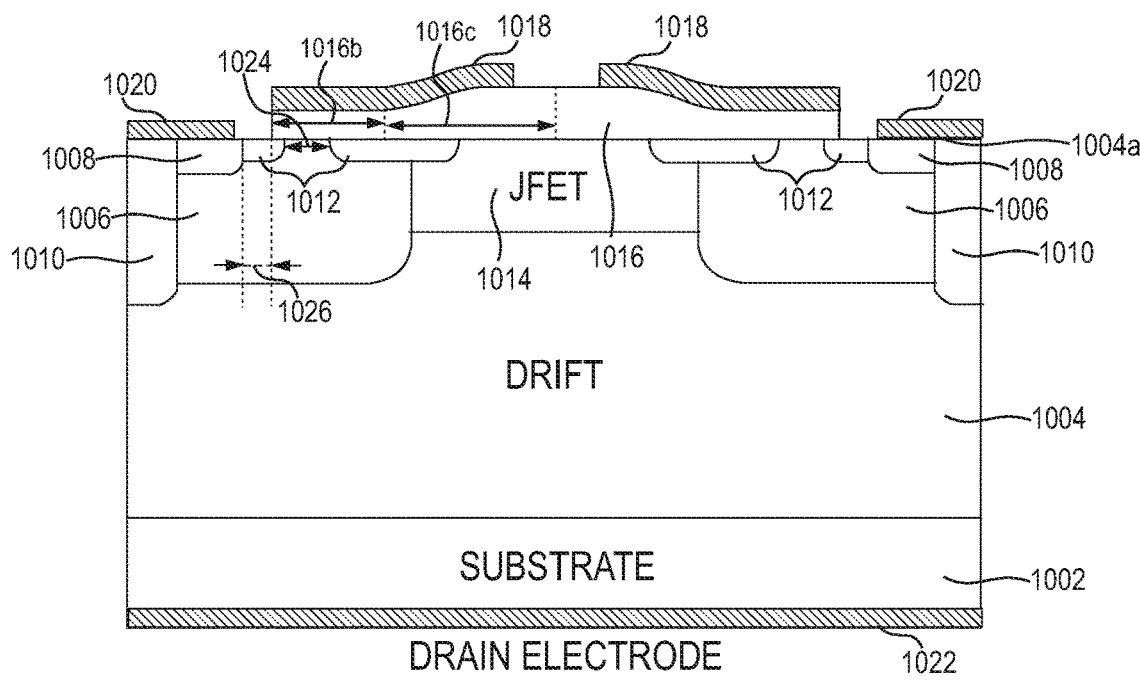
FIG. 10B is a cross sectional illustration of the unit cell structure of the vertical transistor device of FIG. 10A with a source ballast region, in accordance with another exemplary embodiment of the present disclosure.

FIG. 10B is a cross sectional illustration of the unit cell structure of the vertical transistor device 1000 with a source ballast region, in accordance with an exemplary embodiment of the present disclosure. As shown in the FIG. 10B, a length of the buried channel region 1012 may be increased by pulling back the source region 1008 from the gate electrode 1018. A portion of the buried channel region 1012 near the source region 1008 does not simultaneously overlap with the first section 1016b (i.e., thin dielectric region) of the dielectric region 1016 and the gate electrode 1018. This portion of the buried channel region 1012 may be referred as a source ballast region 1026. As mentioned previously with reference to FIG. 9, due to introduction of the source ballast region 926, a source resistance is increased. Further, the source ballast region 1026 also acts as a negative feedback in the MOSFET 1000 which limits a saturation drain current ($I_{DSAT}$) flowing through the channel region. In a more illustrative manner, the negative feedback provided by the source ballast region 1026 helps to improve short-circuit ruggedness in MOSFET devices.

Figure 11:
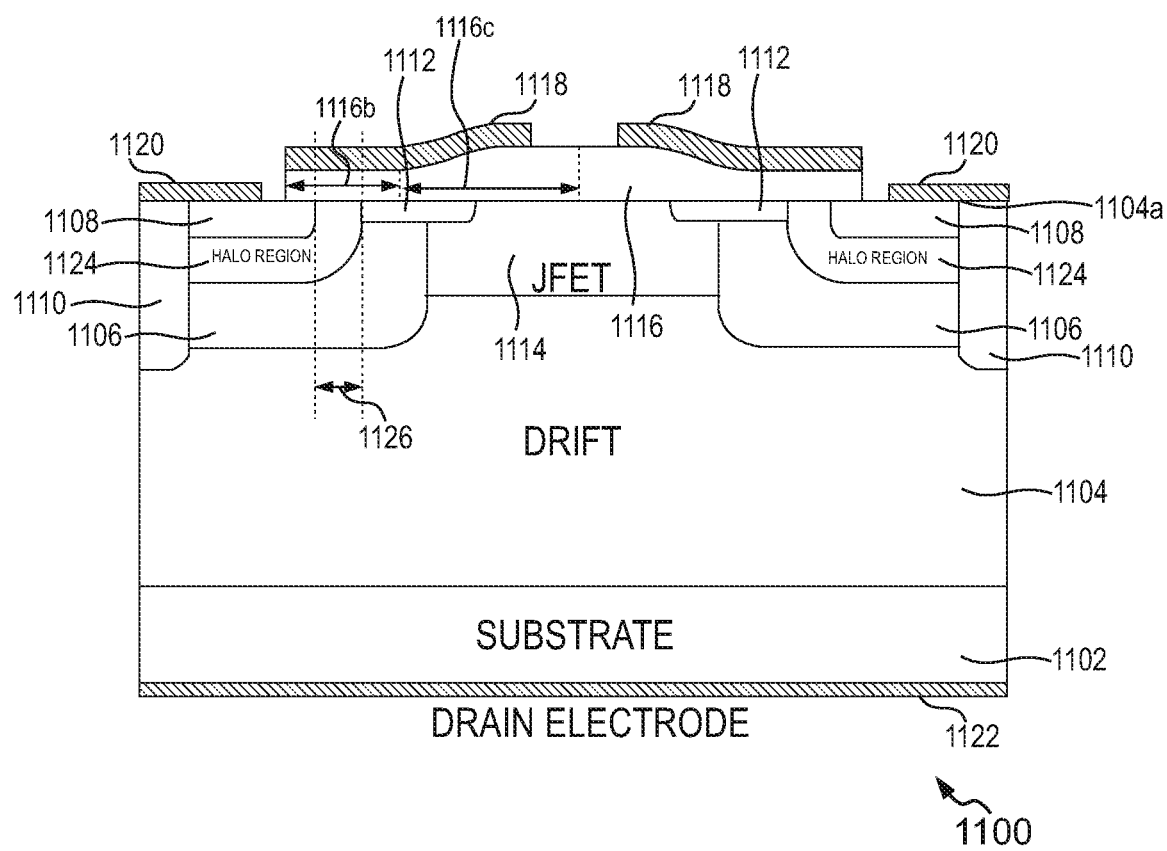
FIG. 11 is a cross sectional illustration of a unit cell structure of a vertical transistor device, in accordance with another exemplary embodiment of the present disclosure.

FIG. 11 is a cross sectional illustration of a unit cell structure of a vertical transistor device 1100, in accordance with an exemplary embodiment of the present disclosure. The vertical transistor device 1100 may be formed by a plurality of unit-cells and some structural elements. For ease of illustration, a single unit cell of the vertical transistor device 1100 will be described. In one embodiment, the vertical transistor device 1100 is a Metal-Oxide Semiconductor Field-Effect Transistor (MOSFET) device and even more preferably a Silicon Carbide (SiC) MOSFET device. For ease of understanding, the term "vertical transistor device 1100" is hereinafter interchangeably referred to as "MOSFET 1100" throughout the description.

The MOSFET 1100 includes a substrate layer 1102, a drift layer 1104 on the substrate layer 1102, one or more body regions 1106 implanted into the drift layer 1104 opposite the substrate layer 1102, and a source region 1108 implanted in the body region 1106 from a top surface 1104a of the drift layer 1104. The MOSFET 1100 further includes a buried channel region 1112 implanted from the top surface 1104a of the drift layer 1104 into each body region 1106, and a junction field effect transistor (JFET) region 1114 between each body region 1106. The MOSFET 1100 also includes a dielectric region 1116 disposed over the top surface 1104a with a gradual step thickness profile, a base region 1110 disposed from the top surface 1104a adjacent to the body region 1106 opposite the JFET region 1114, a gate electrode 1118, a source electrode 1120, and a drain electrode 1122.

The structure of the MOSFET 1100 is similar to the structure of the MOSFET 300 (as shown in FIG. 3A) except that a halo region 1124 is introduced near the source region 1108 in the body region 1106.

As shown in FIG. 11, the halo region 1124 may be formed alongside the source region 308 in a self-aligned manner. A lateral extent of the halo region 1124 may depend on an angle of implant for implanting the halo region 1124 alongside the source region 1124. In one embodiment, the halo region 1124 may be formed by expanding a body mask using a sidewall spacer used for formation of the source region 1108. In another embodiment, a mask including spacers (not shown in Figures) may be formed and patterned over the top surface 1104a of the drift layer 1104 prior to formation of the halo region 1124. The mask including the spacers may be suitably etched and the halo region 1124 may be formed alongside the source region 1108 by the tilted implantation techniques.

In this configuration, the halo region 1102 may be doped with second conductivity type. Further, the doping concentration of the halo region 1124 may be between $1 \times 10^{17}$ cm$^{-3}$ and $1 \times 10^{19}$ cm$^{-3}$. The halo region 1124 overlaps partially with a first section 1116b (i.e., "thin dielectric region") of the dielectric region 1116 and the gate electrode 1118. The halo region 1124 overlapping with the first section 1116b and the gate electrode 1118 may be referred as an inversion channel region 1126. In other words, an interface of the halo region 1124 fully overlaps with the gate electrode 1118 and the first section 1116b of the dielectric region 1116. In addition, the inversion channel region 1126 is formed at the interface between the halo region 1126 and the first section 1116b of the dielectric region 1116.

In one embodiment, a length of the inversion channel region 1126 may in range of about 100 nanometer to 500 nanometer.

As mentioned previously, the inversion channel region degrades the channel mobility and results in increase in magnitude of the gate threshold voltage $V_{TH}$ for switching the MOSFET 1100 from OFF-state to ON-state. Thus, the MOSFET 1100 pertains to a normally-OFF transistor device, where the gate threshold voltage $V_{TH}$ is greater than zero. For example, due to the doping concentration of the halo region 1124, the gate threshold voltage $V_{TH}$ of the MOSFET 1100 with the halo region 1124 may be greater than that of the MOSFET 1100 without the halo region 1124.

Additionally, the MOSFET 1100 may also experience the DIBL effect as described above with reference to FIGS. 10A and 10B. To counter the DIBL effect, a reduced surface electric field (RESURF) region is formed in the buried channel region 1112 where a portion of the gate electrode 1118 overlaps a second section 1116c of the dielectric region 1116, the buried channel region 1012 (as explained with reference to FIG. 5C) and the body region 1006. Due to presence of the RESURF region in the MOSFET 1100, a voltage is reduced at the inner edge of the inversion channel region 1126. The RESURF region is therefore effective in reducing the drain induced barrier lowering (DIBL) effect in the MOSFET 1100.

Figure 12A:
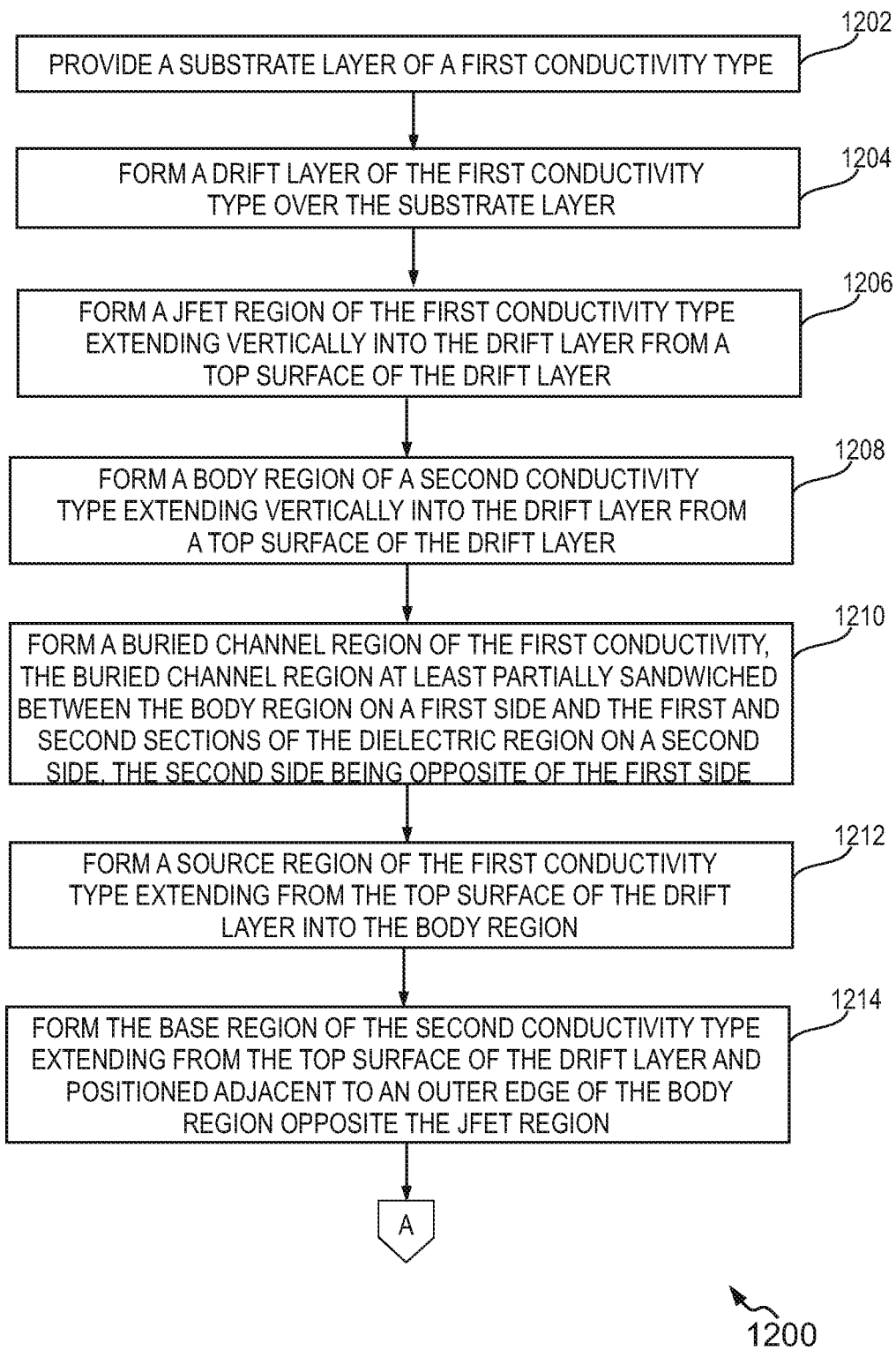
FIGS. 12A and 12B illustrate a flow diagram of a method of manufacturing the vertical transistor device of FIG. 3A, in accordance with an embodiment of the present disclosure.
Figure 12B:
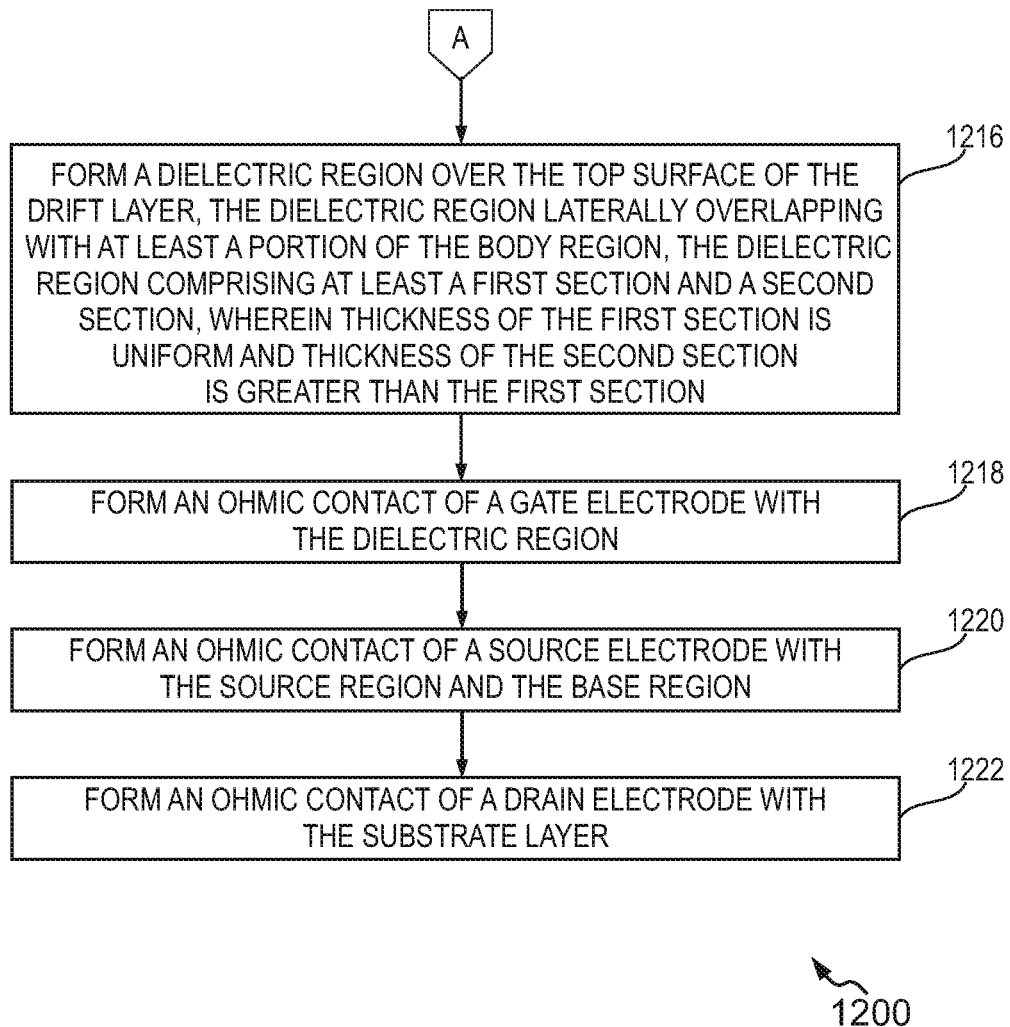

Referring now to FIGS. 12A and 12B, a flow diagram of a method 1200 of manufacturing the vertical transistor device 300 (referring to FIG. 3A), is shown in accordance with an example embodiment. The sequence of operations of the method 1200 may not be necessarily executed in the same order as it is presented. Further, one or more operations may be grouped together and performed in the form of a single step, or one operation may have several sub-steps that may be performed in parallel or in a sequential manner. The method 1200 starts at operation 1202.

At operation 1202, the method 1200 includes providing the substrate layer 302 of a first conductivity type. In one embodiment, the first conductivity type may be N-type dopants.

At operation 1204, the method 1200 includes forming the drift layer 304 of the first conductivity type over the substrate layer 302. In one embodiment, the drift layer 302 may be doped with the first conductivity type (e.g., N-type dopants) at a doping concentration of about $1.5 \times 10^{15}$ cm$^{-3}$ to about $3 \times 10^{16}$ cm$^{-3}$ with a thickness of about 4 to 30 μm.

At operation 1206, the method 1200 includes forming a JFET region 314 of the first conductivity type extending vertically into the drift layer 304 from a top surface 304a of the drift layer 304. In one embodiment, the drift layer 302 may be doped with the first conductivity type (e.g., N-type dopants) at a doping concentration that is equal to or larger than the drift layer with a depth of about 0.5 to 3 μm.

At operation 1208, the method 1200 includes forming the body region 306 of a second conductivity type extending vertically into the drift layer 304 from a top surface 304a of the drift layer 304. In one example, the second conductivity type is opposite to the first conductivity type. In one embodiment, the body region 306 may be doped with the second conductivity type (e.g., P-type SiC or P-type GaN) at a heavy doping concentration of about $1 \times 10^{17}$ cm$^{-3}$ to about $1 \times 10^{19}$ cm$^{-3}$ to a depth of about 0.5 to 3 μm.

At operation 1210, the method 1200 includes forming the buried channel region 312 of the first conductivity type. The buried channel region 312 is at least partially sandwiched between the body region 306 on a first side and the first and second sections of the dielectric region 316 on a second side, where the second side is opposite of the first side. In one embodiment, a portion of the buried channel region 312 near the source region 308 does not overlap with the dielectric region 316 and the non-overlapping portion of the buried channel region 312 act as a source ballast region and increases a source resistance of the MOSFET 300.

At operation 1212, the method 1200 includes forming the source region 308 of the first conductivity type extending from the top surface 304a of the drift layer 304 into the body region 306. In one embodiment, the source region 308 may be doped with the first conductivity type (e.g., N-type SiC or N-type GaN) at a heavy doping concentration of about $1 \times 10^{18}$ cm$^{-3}$ to about $1 \times 10^{21}$ cm$^{-3}$ to a depth of about 0.1 to 0.5 μm.

At operation 1214, the method 1200 includes forming the base region 310 of the second conductivity type extending from the top surface 304a of the drift layer 304 and positioned adjacent to an outer edge (see, 306b) of the body region 306 opposite the JFET region 314.

At operation 1216, the method 1200 includes forming the dielectric region 316 over the top surface 304a of the drift layer 304. The dielectric region 316 laterally overlaps with at least a portion of the body region 306 and a JFET region 314. The dielectric region 316 includes the first section 316b (i.e., "narrow dielectric region") and the second section 316c (i.e., "thick dielectric region"). The thickness of the first section 316b (i.e., "narrow dielectric region") is uniform and thickness of the second section 316c (i.e., "thick dielectric region") is greater than the first section 316b. The second section 316c (i.e., "thick dielectric region") of the dielectric region 316 is adjacent to the first section 316b and has values starting from thickness value of the first section 316b to a maximum thickness value of the dielectric region 316. In one example, the first section 316b of the dielectric region 316 may have a thickness ranging between 250 Angstroms to 1000 Angstroms and the second section 316c (i.e., "thick dielectric region") may have a thickness ranging between 1000 Angstroms to 20000 Angstroms.

At operation 1218, the method 1200 includes forming an ohmic contact of the gate electrode 318 with the dielectric region 316 on a surface opposite the drift layer 304.

At operation 1220, the method 1200 includes forming an ohmic contact of the source electrode 320 with the source region 308 and the base region 310.

At operation 1222, the method 1200 includes forming an ohmic contact of the drain electrode 322 with the substrate layer 302.

Although the present technology has been described with reference to specific exemplary embodiments, it is noted that various modifications and changes may be made to these embodiments without departing from the broad spirit and scope of the present technology.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Also, techniques, subsystems and methods described and illustrated in the various embodiments as discrete or separate may be combined or integrated with other systems, modules, techniques, or methods without departing from the scope of the present technology. Other items shown or discussed as directly coupled or connected with one another, or as directly communicating with each other, may be communicatively associated through some interface or device, such that the items may no longer be considered directly coupled or connected with one another, or directly communicating with each other, but may still be indirectly communicatively associated and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

It should be noted that reference throughout this specification to features, advantages, or similar language does not imply that all of the features and advantages should be or are in any single embodiment. Rather, language referring to the features and advantages may be understood to mean that a specific feature, advantage, or characteristic described in connection with an embodiment may be included in at least one embodiment of the present technology. Thus, discussions of the features and advantages, and similar language, throughout this specification may, but do not necessarily, refer to the same embodiment. Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions may be apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A vertical transistor device, comprising:
a substrate layer of a first conductivity type;
a drift layer of the first conductivity type formed over the substrate layer;
a body region of a second conductivity type extending vertically from a top surface of the drift layer into the drift layer, the second conductivity type being opposite to the first conductivity type;
a junction field effect transistor (JFET) region of the first conductivity type extending vertically from the top surface of the drift layer into the drift layer and positioning adjacent to an inner edge of the body region, wherein doping concentration of the JFET region is same or higher than the drift layer;
a source region of the first conductivity type extending vertically from the top surface of the drift layer into the body region;
a buried channel region of the first conductivity type at least partially sandwiched between the body region on a first side and a dielectric region on a second side, the second side being opposite to the first side, a portion of the buried channel region making an electrical connection with the source region and a portion of the buried channel region also extending beyond a lateral extent of the body region to make an electrical connection with the JFET region;
the dielectric region formed over the top surface of the drift layer, the dielectric region laterally overlapping with at least a portion of the body region, the dielectric region comprising a first section and a second section being adjacent to the first section, wherein thickness of the first section is uniform and thickness of the second section is greater than the first section, and wherein a portion of the second section of the dielectric region overlaps at least the body region and the buried channel region;

a gate electrode formed over the dielectric region; and a drain electrode formed below the substrate layer.

2. The vertical transistor device of claim 1, wherein the vertical transistor device is made of a wide-bandgap semiconductor material.

3. The vertical transistor device of claim 2, wherein the vertical transistor device is a Silicon Carbide (SiC) metal-oxide-semiconductor field-effect transistor (MOSFET), and wherein the vertical transistor device is a normally-on transistor device.

4. The vertical transistor device of claim 3, wherein the buried channel region forms a continuous region extending between the source region and the JFET region.

5. The vertical transistor device of claim 1, further comprising:
a base region of the second conductivity type extending vertically into the drift layer from the top surface of the drift layer and positioned adjacent to an outer edge of the body region opposite the JFET region; and
a source electrode formed over the source region and at least partially overlapping and making an ohmic contact to both the base region and the source region.

6. The vertical transistor device of claim 1, wherein:
a channel region is formed in the buried channel region at a portion where the gate electrode partially overlaps at least the buried channel region and the first section of the dielectric region, and
a reduced surface field (RESURF) region is formed in the buried channel region at a portion where the gate electrode partially overlaps at least the buried channel region, the body region and the second section of the dielectric region.

7. The vertical transistor device of claim 1, wherein thickness profile of the dielectric region is a gradual step function, and wherein the thickness of the second section increases gradually from a thickness value of the first section to the maximum thickness value of the dielectric region.

8. The vertical transistor device of claim 1, wherein the gate electrode has a discontinuous structure and does not overlap with a central portion of the JFET region.

9. The vertical transistor device of claim 1, wherein the buried channel region comprises a source ballast region near the source region which does not simultaneously overlap with the first section of the dielectric region and the gate electrode, and wherein the source ballast region provides a negative feedback to limit a saturation drain current flowing through the channel region.

10. The vertical transistor device of claim 1, where the buried channel region is formed by implantation using the same mask which is used to form the body region.

11. A Silicon Carbide (SiC) vertical transistor device, comprising:
a substrate layer of a first conductivity type;
a drift layer of the first conductivity type formed over the substrate layer;
a body region of a second conductivity type extending vertically from a top surface of the drift layer into the drift layer, the second conductivity type being opposite to the first conductivity type;
a junction field effect transistor (JFET) region of the first conductivity type extending vertically from the top surface of the drift layer into the drift layer and positioning adjacent to an inner edge of the body region, wherein doping concentration of the JFET region is same or higher than the drift layer;
a source region of the first conductivity type extending vertically from the top surface of the drift layer into the body region;
a buried channel region of the first conductivity type formed below the top surface of the drift layer, the buried channel region extending laterally across a portion of the body region and being at least partially overlapped with a dielectric region, a portion of the buried channel region making an electrical connection with the source region and a portion of the buried channel region also extending beyond a lateral extent of the body region to make an electrical connection with the JFET region;
the dielectric region formed over the top surface of the drift layer, the dielectric region laterally overlapping with at least a portion of the body region, the dielectric region comprising a first section and a second section being adjacent to the first section, wherein thickness of the first section is uniform and thickness of the second section is greater than the first section, and wherein a portion of the second section of the dielectric region overlaps at least the body region and the buried channel region;
a base region of the second conductivity type extending vertically into the drift layer from the top surface of the drift layer and positioned adjacent to an outer edge of the body region opposite the JFET region;
a gate electrode formed over the dielectric region, wherein the gate electrode has a discontinuous structure and does not overlap a central portion of the JFET region;
a source electrode formed over the source region and at least partially overlapping the base region; and
a drain electrode formed below the substrate layer.

12. The vertical transistor device of claim 11, wherein:
a channel region is formed in the buried channel region at a portion where the gate electrode partially overlaps at least the buried channel region and the first section of the dielectric region, and
a reduced surface field (RESURF) region is formed in the buried channel region at a portion where the gate electrode partially overlaps at least the buried channel region, the body region, and the second section of the dielectric region.

13. The vertical transistor device of claim 11, wherein the buried channel region is formed in an interrupted manner such that an inversion channel is formed below a portion of the first section of the dielectric region, and wherein the portion of the first section of the dielectric region overlaps the gate electrode and does not overlap the buried channel region.

14. The vertical transistor device of claim 13, wherein the vertical transistor device is a normally-off transistor device due to presence of the inversion channel.

15. The vertical transistor device of claim 11, wherein the buried channel region comprises a source ballast region near the source region which does not simultaneously overlap with the first section of the dielectric region and the gate electrode, and wherein the source ballast region provides a negative feedback to limit a saturation drain current flowing through the channel region.

16. A vertical Silicon Carbide (SiC) metal-oxide-semiconductor field-effect transistor (MOSFET), the vertical SiC MOSFET comprising:
a substrate layer of a first conductivity type;

a drift layer of the first conductivity type formed over the substrate layer;

a body region of a second conductivity type extending vertically into the drift layer from a top surface of the drift layer, the second conductivity type being opposite to the first conductivity type;

a junction field effect transistor (JFET) region of the first conductivity type positioning adjacent to an inner edge of the body region and extending vertically from the top surface of the drift layer into the drift layer, wherein doping concentration of the JFET region is same or higher than the drift layer;

a source region of the first conductivity type extending vertically from the top surface of the drift layer into the body region;

a buried channel region of the first conductivity type at least partially sandwiched between the body region on a first side and a dielectric region on a second side, the second side being opposite to the first side, the buried channel region extending beyond a lateral extent of the body region to make an electrical connection with the JFET region;

the dielectric region formed over the top surface of the drift layer, the dielectric region laterally overlapping with at least a portion of the body region, the dielectric region comprising a first section and a second section being adjacent to the first section, wherein thickness profile of the dielectric region has a gradual step function, wherein thickness of the first section is uniform and thickness of the second section is greater than the first section, and wherein a portion of the second section of the dielectric region overlaps at least the body region and the buried channel region;

a base region of the second conductivity type extending vertically from the top surface of the drift layer into the drift layer and positioned adjacent to an outer edge of the body region opposite the JFET region;

a gate electrode formed over the dielectric region, wherein the gate electrode has a discontinuous structure and does not overlap a central portion of the JFET region; and a drain electrode formed below the substrate layer.

17. The vertical SiC MOSFET of claim 16, further comprising:

a source electrode formed over the source region and at least partially overlapping the base region.

18. The vertical SiC MOSFET of claim 16, wherein:

a channel region is formed in the buried channel region at a portion where the gate electrode partially overlaps at least the buried channel region and the first section of the dielectric region, and a reduced surface field (RESURF) region is formed in the buried channel region at a portion where the gate electrode partially overlaps at least the buried channel region, the body region and the second section of the dielectric region.

19. The vertical SiC MOSFET of claim 16, further comprising:

a halo region of the second conductivity type formed in a self-aligned manner adjacent to the source region using tilted implantation through the same mask as what is used to form the source region.

20. The vertical SiC MOSFET of claim 19, wherein the halo region extends laterally in the body region and an interface of the halo region and the first section of the dielectric region fully overlaps with the gate electrode, and wherein an inversion channel is formed at the interface between the halo region and the first section of the dielectric region.

* * * * *